(12) United States Patent
Lee et al.

(10) Patent No.: US 11,296,104 B2
(45) Date of Patent: Apr. 5, 2022

(54) THREE DIMENSIONAL SEMICONDUCTOR DEVICE AND METHOD OF FORMING THE SAME

(71) Applicant: Samsung Electronics Co., Ltd., Suwon-si (KR)

(72) Inventors: Chang Sup Lee, Hwaseong-si (KR); Phil Ouk Nam, Suwon-si (KR); Sung Yun Lee, Seongnam-si (KR); Chang Seok Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/845,236

(22) Filed: Apr. 10, 2020

(65) Prior Publication Data
US 2020/0243554 A1 Jul. 30, 2020

Related U.S. Application Data

(63) Continuation of application No. 15/722,485, filed on Oct. 2, 2017, now Pat. No. 10,629,609.

(30) Foreign Application Priority Data

Mar. 9, 2017 (KR) .......................... 10-2017-0029854

(51) Int. Cl.
*H01L 27/11575* (2017.01)
*H01L 23/528* (2006.01)
(Continued)

(52) U.S. Cl.
CPC ...... *H01L 27/11575* (2013.01); *H01L 23/528* (2013.01); *H01L 23/5226* (2013.01);
(Continued)

(58) Field of Classification Search
CPC .............. H01L 23/5226; H01L 23/528; H01L 23/53295; H01L 27/1157; H01L 27/11548;
(Continued)

(56) References Cited

U.S. PATENT DOCUMENTS

| 7,518,920 B2 | 4/2009 | Kang |
| 9,006,884 B2 | 4/2015 | Lee et al. |

(Continued)

FOREIGN PATENT DOCUMENTS

| JP | 2011222994 A | 11/2011 |
| KR | 1020120053329 A | 5/2012 |
| KR | 1020150116681 A | 10/2015 |

OTHER PUBLICATIONS

Notice of Allowance dated Nov. 30, 2021 for corresponding application No. KR 10-2017-0029854.

*Primary Examiner* — Matthew E Warren
(74) *Attorney, Agent, or Firm* — Muir Patent Law, PLLC

(57) ABSTRACT

A three-dimensional semiconductor device and a method of forming the same are provided. The three-dimensional semiconductor device comprises a substrate including first and second areas; first and second main separation patterns, disposed on the substrate and intersecting the first and second areas; gate electrodes disposed between the first and second main separation patterns and forming a stacked gate group, the gate electrodes sequentially stacked on the first area and extending in a direction from the first area to the second area; and at least one secondary separation pattern disposed on the second area, disposed between the first and second main separation patterns, and penetrating through the gate electrodes disposed on the second area. The gate electrodes include pad portions on the second area, and the pad portions are thicker than the gate electrodes disposed on (Continued)

the first area and in contact with the at least one secondary separation pattern.

15 Claims, 31 Drawing Sheets

(51) Int. Cl.
*H01L 23/522* (2006.01)
*H01L 27/11582* (2017.01)
*H01L 27/11548* (2017.01)
*H01L 27/11556* (2017.01)
*H01L 23/532* (2006.01)
*H01L 27/1157* (2017.01)
*H01L 27/11565* (2017.01)
*H01L 27/11578* (2017.01)

(52) U.S. Cl.
CPC .... *H01L 23/53295* (2013.01); *H01L 27/1157* (2013.01); *H01L 27/11548* (2013.01); *H01L 27/11556* (2013.01); *H01L 27/11565* (2013.01); *H01L 27/11578* (2013.01); *H01L 27/11582* (2013.01)

(58) Field of Classification Search
CPC ......... H01L 27/11551; H01L 27/11556; H01L 27/11565; H01L 27/11575; H01L 27/11578; H01L 27/11582
USPC .................................................. 257/365, 734
See application file for complete search history.

(56) References Cited

U.S. PATENT DOCUMENTS

| | | | |
|---|---|---|---|
| 2013/0020647 A1* | 1/2013 | Hwang | H01L 27/11582 257/365 |
| 2015/0137216 A1 | 5/2015 | Lee et al. | |
| 2015/0255385 A1 | 9/2015 | Lee et al. | |
| 2015/0372101 A1* | 12/2015 | Lee | H01L 27/11519 257/314 |
| 2017/0179025 A1* | 6/2017 | Yun | H01L 27/11565 |
| 2017/0352678 A1 | 12/2017 | Lu et al. | |
| 2018/0026047 A1* | 1/2018 | Park | H01L 27/11582 257/314 |
| 2018/0053686 A1 | 2/2018 | Hyun et al. | |

* cited by examiner

THREE DIMENSIONAL SEMICONDUCTOR DEVICE AND METHOD OF FORMING THE SAME

CROSS-REFERENCE TO RELATED APPLICATION

This application is a continuation application of U.S. application Ser. No. 15/722,485, filed Oct. 2, 2017, which claims the benefit of priority under 35 USC § 119 to Korean Patent Application No. 10-2017-0029854, filed on Mar. 9, 2017 in the Korean Intellectual Property Office, the disclosure of each of which is incorporated herein by reference in its entirety.

BACKGROUND

1. Field

The present disclosure relates to a semiconductor device, and for example, to a three-dimensional semiconductor device and a method of forming the same.

2. Description of Related Art

In order to increase the price competitiveness of various products, demand for an improved degree of integration in a semiconductor device has been increased. New three-dimensional semiconductor devices have been proposed, in order to improve a degree of integration in the semiconductor devices.

SUMMARY

An aspect of the present disclosure may provide a three-dimensional semiconductor device having improved reliability and a method of forming the same.

An aspect of the present disclosure may provide a three-dimensional semiconductor device having improved durability and a method of forming the same.

According to an aspect of the present disclosure, a three-dimensional semiconductor device is provided. The three-dimensional semiconductor device comprises a substrate including a first area and a second area. The three-dimensional semiconductor device comprises a first gate electrode and a second gate electrode, sequentially stacked on the first area of the substrate and extending parallel to a surface of the substrate and in a first direction from the first area to the second area. Each of the first gate electrode and the second gate electrode includes a first cell gate portion disposed on the first area and includes a first gate extension portion and a second gate extension portion, extended from the first cell gate portion in the first direction. The first gate electrode includes a first pad portion, while the second gate electrode includes a second pad portion. The three-dimensional semiconductor device comprises channel structures disposed on the first area of the substrate and penetrating through the first gate electrode and the second gate electrode. The second pad portion of the second gate electrode is disposed on an end portion of the second gate extension portion of the second gate electrode, while the second gate electrode includes a protruding portion disposed on an end portion of the first gate extension portion of the second gate electrode.

According to an aspect of the present disclosure, a three-dimensional semiconductor device is provided. The three-dimensional semiconductor device comprises a substrate including a first area and a second area. The three-dimensional semiconductor device includes a first main separation pattern and a second main separation pattern, disposed on the substrate and intersecting the first area and the second area of the substrate. The three-dimensional semiconductor device comprises gate electrodes disposed between the first main separation pattern and the second main separation pattern and forming a stacked gate group. The gate electrodes are sequentially stacked on the first area of the substrate extending in a direction from the first area to the second area. The three-dimensional semiconductor device comprises at least one secondary separation pattern disposed on the second area of the substrate, disposed between the first main separation pattern and the second main separation pattern, and penetrating through the gate electrode disposed on the second area of the substrate. Each of the gate electrodes includes a pad portion on the second area of the substrate. The pad portion is thicker than the each of the gate electrodes disposed on the first area and contacts the at least one secondary separation pattern.

According to an aspect of the present disclosure, a three-dimensional semiconductor device is provided. The three-dimensional semiconductor device comprises a substrate including a first area and a second area; a first main separation pattern and a second main separation pattern, disposed on the substrate and intersecting the first area and the second area of the substrate; gate electrodes disposed between the first main separation pattern and the second main separation pattern and forming stacked gate groups, the gate electrodes being sequentially stacked on the first area of the substrate, being extended in a direction from the first area to the second area, and including pad portions on the second area of the substrate; at least one secondary separation pattern disposed on the second area of the substrate, disposed between the first main separation pattern and the second main separation pattern, and penetrating through the gate electrodes disposed on the second area of the substrate; and contact plugs on the pad portions. The contact plugs extend in a direction from an upper surface of the pad portions to an inside of the pad portions, and the pad portions contact the at least one secondary separation pattern.

According to an aspect of the present disclosure, a three-dimensional semiconductor device is provided. The three-dimensional semiconductor device comprises a substrate including a first area and a second area; a first main separation pattern and a second main separation pattern, disposed on the substrate and intersecting the first area and the second area of the substrate; gate electrodes disposed between the first main separation pattern and the second main separation pattern and forming a plurality of stacked gate groups, the gate electrodes sequentially stacked on the first area of the substrate and extending in a direction from the first area to the second area; a first upper dummy pattern and a second upper dummy pattern disposed on an uppermost stacked gate group of the plurality of stacked gate groups, the first upper dummy pattern extending in the direction from the first area to the second area, the second upper dummy pattern disposed to be spaced apart from the gate electrodes overlapping the first area; a buffer line disposed on the first upper dummy pattern; a string select line disposed on the buffer line, the string select line including a lower string select line and an upper string select line on the lower string select line. A pad portion of the lower string select line and a pad portion of the first upper dummy pattern are arranged to have a stepped structure formed downwardly in a first direction from the first area, and pad portions of the second upper dummy pattern having a stepped structure formed downwardly in a second direction perpendicular to the first direction.

According to an aspect of the present disclosure, a method of forming a semiconductor device is provided. The method comprises forming a mold structure on a substrate including a first area and a second area, the mold structure including interlayer insulating layers and sacrificial layers, alternately and repeatedly stacked; forming steps on the second area of the substrate by patterning the mold structure; exposing the sacrificial layers of the mold structure by forming a first main separation trench and a second main separation trench, penetrating through the mold structure and forming at least one secondary separation trench between the first main separation trench and the second main separation trench, the at least one secondary separation trench penetrating through a portion of the steps and the sacrificial layers through which the at least one secondary separation trench penetrates being formed using sacrificial pad portions and sacrificial protruding portions, disposed to be spaced apart from each other by the at least one secondary separation trench; substituting the sacrificial layers that have been exposed with gates, the gates including pad portions formed by substituting the sacrificial pad portions and protruding portions formed by substituting the sacrificial protruding portions; and forming a first main separation pattern and a second main separation pattern, filling the first main separation trench and the second main separation trench, respectively, and a secondary separation pattern filling the at least one secondary separation trench.

According to an aspect of the present disclosure, a method of forming a semiconductor device is provided. The method comprises forming a mold structure on a substrate including a first area and a second area, the mold structure including interlayer insulating layers and sacrificial layers, alternately and repeatedly stacked; forming steps on the second area of the substrate by patterning the mold structure; forming sacrificial patterns, in contact with the sacrificial layers, on an upper surfaces of the steps; exposing the sacrificial layers and the sacrificial patterns of the mold structure by forming a first main separation trench and a second main separation trench, penetrating through the mold structure and forming at least one secondary separation trench between the first main separation trench and the second main separation trench; substituting the sacrificial layers that have been exposed and the sacrificial patterns with gates; and forming a first main separation pattern and a second main separation pattern, filling the first main separation trench and the second main separation trench, respectively, and a secondary separation pattern filling the at least one secondary separation trench.

BRIEF DESCRIPTION OF DRAWINGS

The above and other aspects, features and other advantages of the present disclosure will be more clearly understood from the following detailed description, when taken in conjunction with the accompanying drawings.

DETAILED DESCRIPTION

Figure 1:
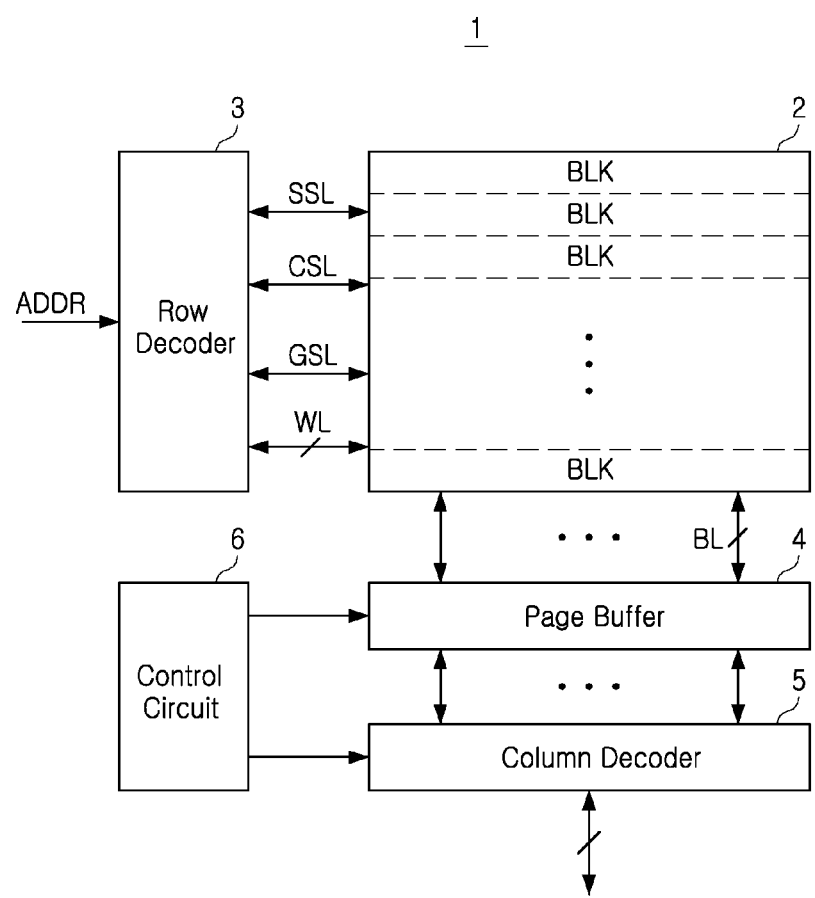
FIG. 1 is a schematic block diagram of a three-dimensional semiconductor device according to an example embodiment of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

As used herein, and unless indicated otherwise, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) that does not permit electric current to pass therethrough is not electrically connected to that component.

With reference to FIGS. 1 to 16B, a three-dimensional semiconductor device according to example embodiments will be described. With reference to FIGS. 1 to 10, the three-dimensional semiconductor device according to an example embodiment will be described. The three-dimensional semiconductor device according to an example embodiment may be described with reference to FIGS. 1 to 10 as a whole, but will be described with reference to each of FIGS. 1 to 10 or combinations thereof for the sake of easier understanding or description thereof. Thus, even in the case that the three-dimensional semiconductor device is described with reference to each of FIGS. 1 to 10 or combinations thereof, other drawings not directly described among FIGS. 1 to 10 may also be considered to illustrate the three-dimensional semiconductor device.

With reference to FIG. 1, a three-dimensional semiconductor device 1 according to an example embodiment will be described. FIG. 1 is a schematic block diagram of the three-dimensional semiconductor device according to an example embodiment of the present disclosure.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

With reference to FIG. 1, the three-dimensional semiconductor device 1 may include a memory cell array 2, a row decoder 3, a page buffer 4, a column decoder 5, and a control circuit 6. The memory cell array 2 may include a plurality of memory blocks BLK.

The memory cell array 2 may include a plurality of memory cells arranged in a plurality of rows and columns. The plurality of memory cells included in the memory cell array 2 may be electrically connected to the row decoder 3 by a plurality of word lines WL, at least one common source line CSL, a plurality of string select lines SSL, at least one ground select line GSL, or the like. The plurality of memory cells may be electrically connected to the page buffer 4 and the column decoder 5 by a plurality of bit lines BL. In an example embodiment, the plurality of memory cells arranged in the same row may be connected to a common word line WL, while the plurality of memory cells arranged in the same column may be connected to a common bit line BL.

The row decoder 3 may be connected to the plurality of memory blocks BLK, and may provide a driving signal to word lines WL of the memory blocks BLK selected depending on a block select signal. For example, the row decoder 3 may receive address information ADDR from an external source and decode the address information ADDR that has been received, thereby determining a voltage to be supplied to at least a portion of the word lines WL, the common source line CSL, the string select lines SSL, and the ground select line GSL, electrically connected to the memory cell array 2.

The page buffer 4 may be electrically connected to the memory cell array 2 by the bit lines BL. The page buffer 4 may be connected to a bit line BL selected depending on an address decoded by the column decoder 5. The page buffer 4 may temporarily store data to be stored in memory cells or may detect data stored in the memory cells depending on an operating mode. For example, the page buffer 4 may be operated as a writing driver circuit in an operating mode of a program, and may be operated as a sense amplifier circuit in a reading mode. The page buffer 4 may receive electrical energy (e.g., a voltage or an electric current) from a control logic to be transmitted to the bit line BL that has been selected.

The column decoder 5 may provide a data transmission path between the page buffer 4 and an external device (e.g., a memory controller). The column decoder 5 may decode an address input from an external source to select one of the bit lines BL. The column decoder 5 may be connected to the memory blocks BLK and may provide data information to bit lines BL of a memory block BLK selected depending on the block select signal.

The control circuit 6 may control overall operations of the three-dimensional semiconductor device 1. The control circuit 6 may receive a control signal and an external voltage and may be operated according to the control signal that has been received. The control circuit 6 may include a voltage generator generating voltages required for an internal operation (e.g., a program voltage, a read voltage, an erase voltage, or the like) using the external voltage. The control circuit 6 may control a read operation, a write operation and/or an erase operation in response to control signals.

Figure 2:
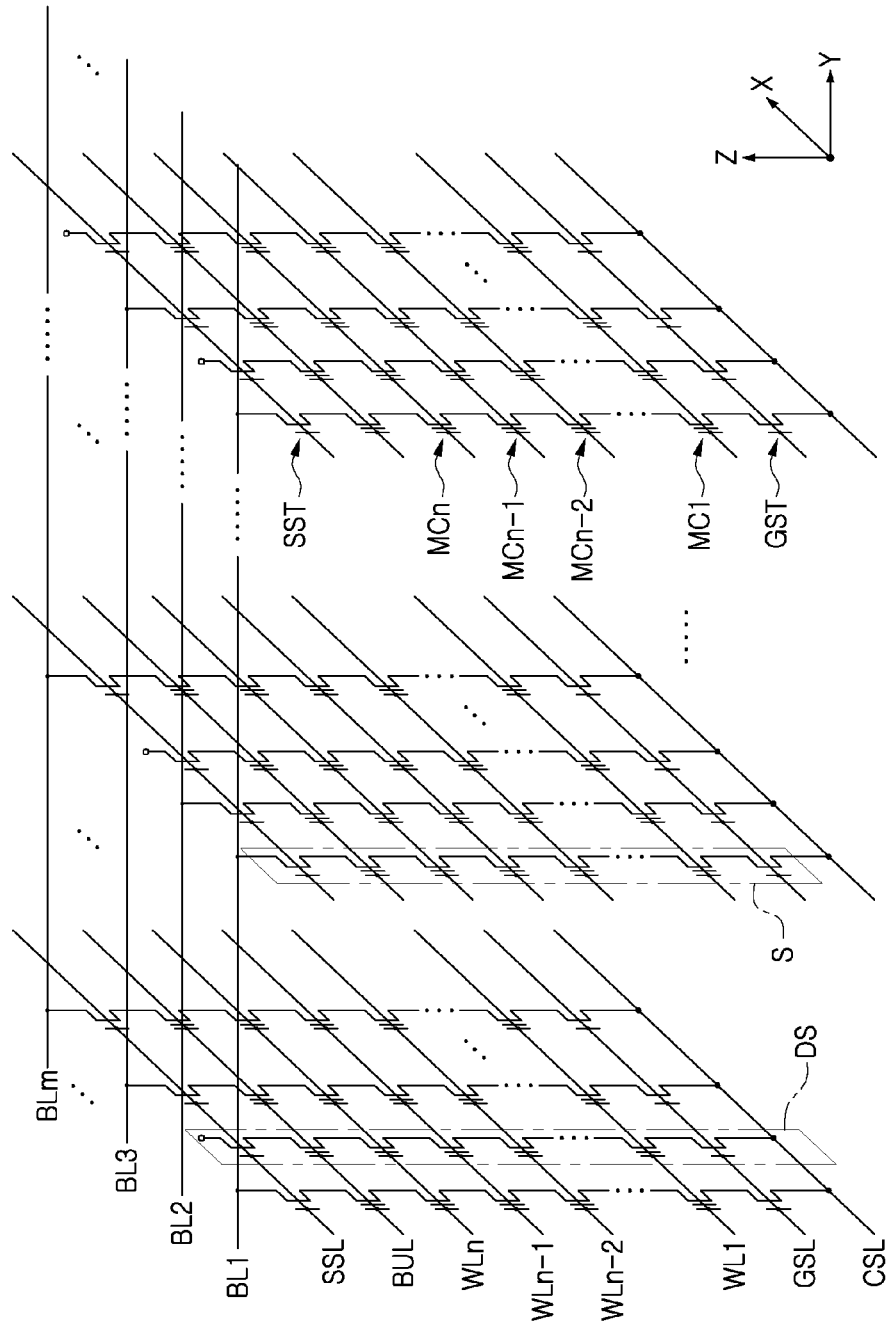
FIG. 2 is a circuit diagram of a memory cell array of a three-dimensional semiconductor device according to an example embodiment of the present disclosure.

With reference to FIG. 2, a circuit of the memory cell array (2 of FIG. 1) of the three-dimensional semiconductor device (1 of FIG. 1) illustrated in FIG. 1 will be described. FIG. 2 is a schematic circuit diagram of the memory cell array 2. The three-dimensional semiconductor device according to an example embodiment may include a vertical NAND flash memory device.

With reference to FIG. 2, the memory cell array (2 of FIG. 1) may include a plurality of memory cell strings S including n memory cells MC1 to MCn connected in series, as well as a ground select transistor GST and a string select transistor SST, connected to opposing ends of the memory cells MC1 to MCn in series. N memory cells MC1 to MCn, connected in series, may be connected to n word lines WL1 to WLn, respectively, for selecting the memory cells MC1 to MCn.

In an example embodiment, in each string of the plurality of memory cell strings S, a lower dummy cell may be disposed between the ground select transistor GST and a first memory cell MC1.

In an example embodiment, in each string of the plurality of memory cell strings S, a dummy cell or a buffer cell may be disposed between the string select transistor SST and an nth memory cell MCn. For instance, a dummy memory cell electrically connected to a dummy gate or dummy word line may not have any connection to a bit line to transmit data there between as with normal memory cells. Alternatively or additionally, in some embodiments, a dummy cell may be a memory cell to a word line that is not electrically activated to receive read and/or write voltages, and/or may be a memory cell whose data is ignored by a memory controller. As such, whether or not data is stored in a dummy memory cell, the dummy memory cell may not function to result in communication of any data in such dummy memory cells to a source external to the memory device.

A gate terminal of the ground select transistor GST may be connected to the ground select line GSL, while a source terminal may be connected to the common source line CSL. A gate terminal of the string select transistor SST may be connected to the string select line SSL, while the source terminal may be connected to a drain terminal of memory cells MCn. FIG. 2 illustrates a structure in which a single ground select transistor GST and a single string select transistor SST are connected to n memory cells MC1 to MCn, connected in series. Alternatively, a plurality of ground select transistors GST or a plurality of string select transistors SST may also be connected thereto.

In an example embodiment, a dummy line or a buffer line BUL may be disposed between an uppermost word line WLn and the string select line SSL among the word lines WL1 to WLn. As disclosed above, according to example embodiments, a dummy cell or a buffer cell may be disposed between the string select transistor SST and an nth memory cell MCn. This arrangement may be repeated in each string of the plurality of memory cell strings S that constitutes a memory block. For example, dummy cells in strings are placed so as to be connected in common to a dummy word line or a buffer line BUL. In some embodiments, the same or lower voltage that is applied to unselected word lines may be applied to the dummy word line.

A drain terminal of the string select transistor SST may be connected to a plurality of bit lines BL1 to BLm. When a signal is applied to a gate terminal of the string select transistor SST through the string select line SSL, a signal applied through the bit lines BL1 to BLm may be transmitted to n memory cells MC1 to MCn, connected in series to perform a data reading and writing operation. In addition, an erase voltage having a predetermined level may be applied through a well region formed in a substrate, thereby performing an erase operation erasing data recorded in the memory cells MC1 to MCn.

The three-dimensional semiconductor device according to an example embodiment may include at least one dummy string DS. The dummy string DS may be provided as a string including a dummy channel electrically isolated from the bit lines BL1 to BLm.

Figure 3:
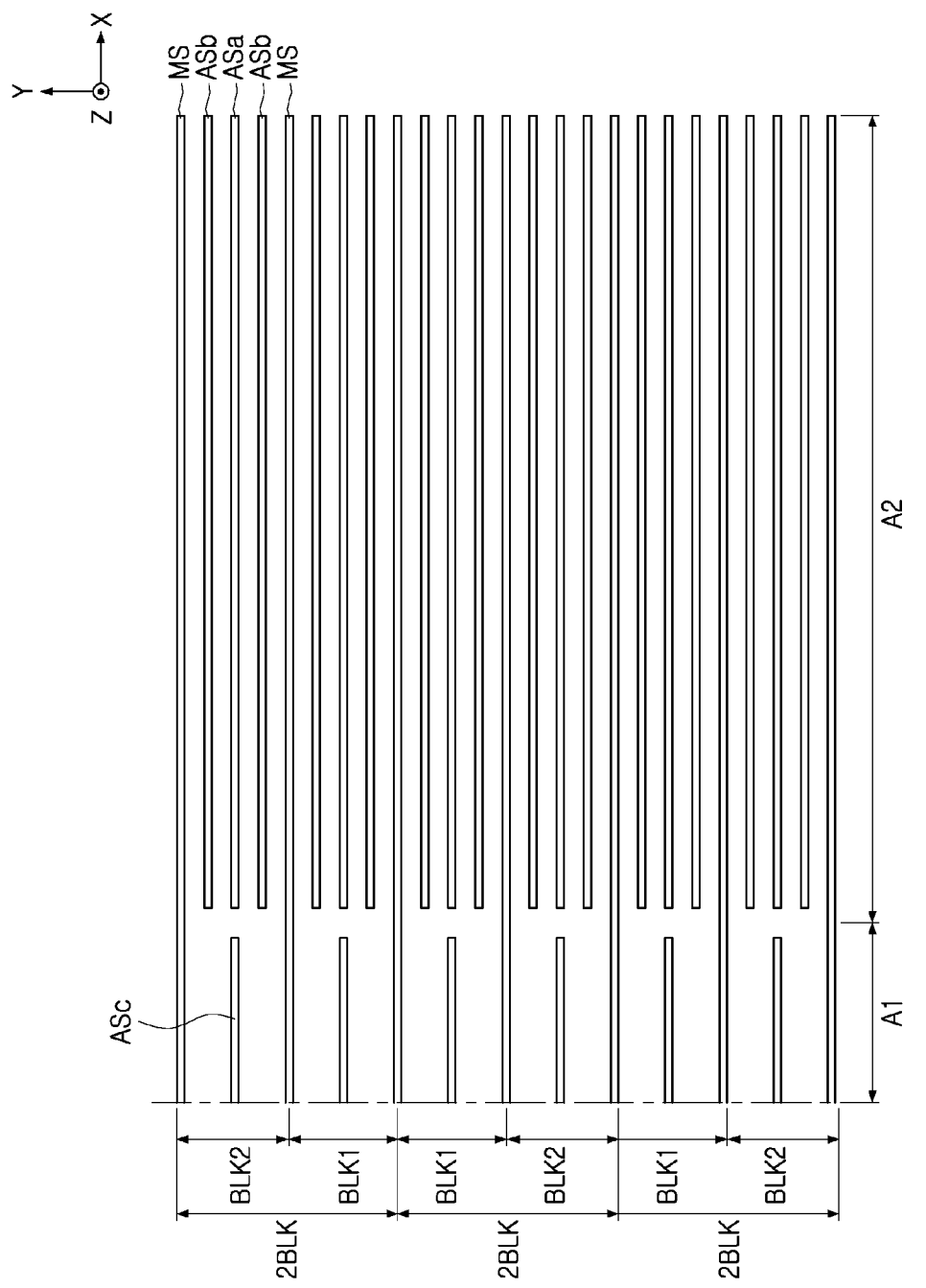
FIG. 3 is a schematic top view of a component of a three-dimensional semiconductor device according to an example embodiment of the present disclosure.

Subsequently, with reference to FIG. 3, a schematic description of the memory blocks BLK of the memory cell array (2 of FIG. 1) described in FIG. 1 will be provided. FIG. 3 is a schematic top view of a component of a three-dimensional semiconductor device according to an example embodiment.

With reference to FIG. 3, the memory cell array (2 of FIG. 1) described in FIG. 1 may include pair of memory blocks 2BLK including a first memory block BLK1 and a second memory block BLK2. The first memory block BLK1 may have a mirror symmetrical structure or a bilaterally symmetrical structure with respect to the second memory block BLK2.

The memory blocks BLK of the memory cell array (2 of FIG. 1) may be formed in such a manner that the pair of memory blocks 2BLK are repeatedly arranged. Thus, the memory blocks BLK of the memory cell array (2 of FIG. 1) may include pairs of memory blocks 2BLK repeatedly arranged in a direction (a Y direction).

The memory blocks BLK of the memory cell array (2 of FIG. 1) may be divided by main separation patterns MS provided in a linear manner and extending in a first direction (an X direction). For example, each of the first memory block BLK1 and the second memory block BLK2 may be disposed between a pair of main separation patterns MS disposed adjacent to each other.

A first secondary separation pattern ASa, second secondary separation patterns ASb, and a cell secondary separation pattern ASc may be disposed between the pair of main separation patterns MS. The first secondary separation pattern ASa may be disposed between the second secondary separation patterns ASb. The cell secondary separation pattern ASc may have an end portion opposing the first secondary separation pattern ASa.

Figure 4:
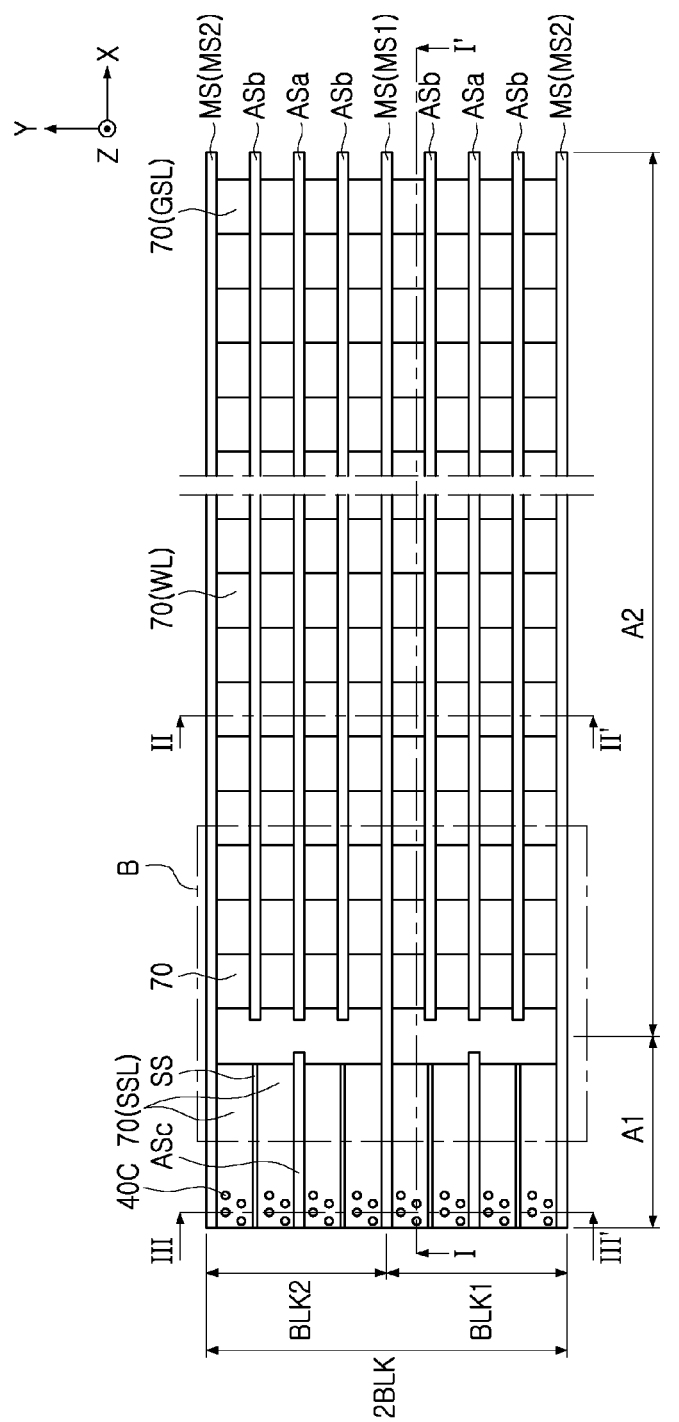
FIG. 4 is a top view of an example of an area of FIG. 3.

Subsequently, with reference to FIGS. 4 and 5 together with FIG. 3, the pair of memory blocks (each pair labeled 2BLK of FIG. 2) described in FIG. 2 will be described. FIG. 4 is a top view of an example of an area of FIG. 3, while FIG. 5 is a perspective view illustrating area "B" of FIG. 4 in three dimensions.

Figure 5:
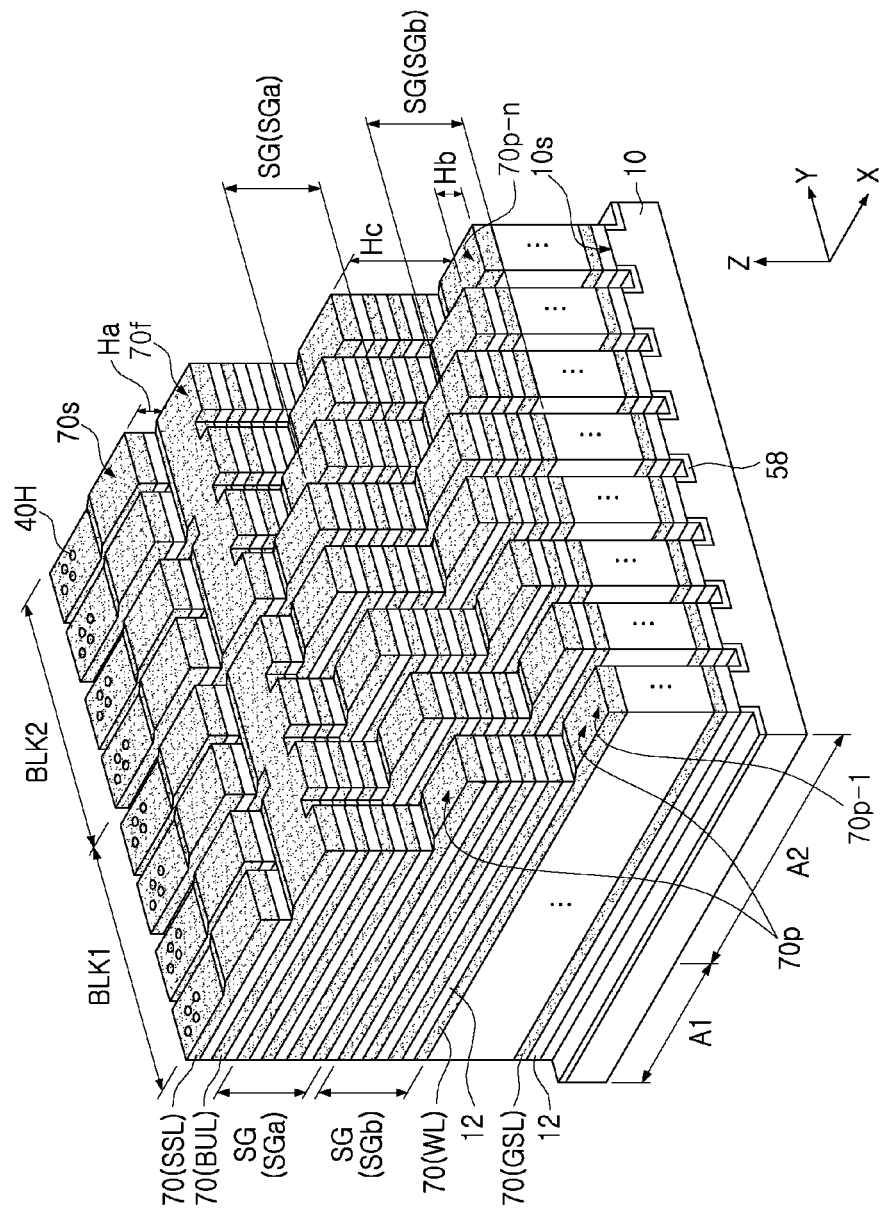
FIG. 5 is a perspective view illustrating area "B" of FIG. 4 in three dimensions.

With reference to FIGS. 4 and 5 together with FIG. 3, the main separation patterns MS, the first secondary separation pattern ASa, the second secondary separation patterns ASb, and the cell secondary separation pattern ASc may be disposed on a substrate 10 having a first area A1 (e.g., first region) and a second area A2 (e.g., second region). The main separation patterns MS, the first secondary separation pattern ASa, the second secondary separation patterns ASb, and the cell secondary separation pattern ASc may be formed to have the same width (e.g., in the Y direction) and height (e.g., in the Z direction).

The main separation patterns MS may be provided in a linear manner and may extend in parallel with a surface 10s of the substrate 10 and in a first direction (the X direction). The memory blocks BLK of the memory cell array (2 of FIG. 1) limited by the main separation patterns MS may be arranged in a second direction (the Y direction) perpendicular to the first direction (the X direction) and parallel to the surface 10s of the substrate 10. The substrate 10 may be provided as a semiconductor substrate formed using a semiconductor material, such as a silicon material, or the like.

The main separation patterns MS may intersect the first area A1 and the second area A2 of the substrate 10. For example, the main separation patterns MS may extend continuously along both the first area A1 (e.g., first region) and the second area A2 (e.g., second region). Thus, the main separation patterns MS may be formed on the first area A1 and the second area A2 of the substrate 10.

The first secondary separation pattern ASa and the second secondary separation patterns ASb may be formed on the second area A2 of the substrate 10. Thus, the first secondary separation pattern ASa and the second secondary separation patterns ASb may overlap the second area A2 of the substrate 10 and may not overlap the first area A1 of the substrate 10.

The cell secondary separation pattern ASc may be formed on the first area A1 of the substrate 10. Thus, the cell secondary separation pattern ASc may overlap the first area A1 of the substrate 10 and may not overlap the second area A2 of the substrate 10. The cell secondary separation pattern ASc and the first secondary separation pattern ASa may have end portions facing each other and may be disposed to be spaced apart from each other (e.g., in the X direction).

Gate electrodes 70 arranged in a third direction (a Z direction) perpendicular to the surface 10s of the substrate 10 and perpendicular to the first direction (the X direction) and the second direction (the Y direction) may be disposed on the first area A1 and the second area A2 of the substrate 10. Interlayer insulating layers 12 may be disposed on the substrate 10. The interlayer insulating layers 12 may be interposed between the gate electrodes 70 and between the gate electrodes 70 and the substrate 10. The interlayer insulating layers 12 may be formed using a silicon oxide.

The main separation patterns MS may penetrate through the gate electrodes 70 and allow the gate electrodes 70 to be disposed to be spaced apart from each other. Thus, the gate electrodes 70 may be disposed between the main separation patterns MS.

The cell secondary separation pattern ASc may penetrate through the gate electrodes 70 disposed on the first area A1 of the substrate 10, while the first secondary separation pattern ASa and the second secondary separation patterns ASb may penetrate through the gate electrodes 70 disposed on the second area A2 of the substrate 10. The gate electrodes 70 disposed between the main separation patterns MS disposed adjacent to each other may form a single memory block BLK.

An uppermost gate electrode, among the gate electrodes 70, may be disposed on the first area A1 of the substrate 10. For example, the uppermost gate electrode, among the gate electrodes 70, may overlap the first area A1 of the substrate 10 and may not overlap the second area A2 of the substrate 10.

The uppermost gate electrode, among the gate electrodes 70, may be divided by the main separation patterns MS and the cell secondary separation pattern ASc, as well as by the string separation patterns SS disposed between the main separation patterns MS and the cell secondary separation pattern ASc. Gate electrodes disposed to be spaced apart from each other by the main separation patterns MS, the cell secondary separation pattern ASc, and the string separation patterns SS may be provided as the string select lines (SSL of FIG. 2) described above. Each of the string separation patterns SS may be disposed between a single main separation pattern MS and the cell secondary separation pattern ASc disposed adjacently to each other.

A lowermost gate electrode, among the gate electrodes 70, may be provided as the ground select line (GSL of FIG. 2) described above. Gate electrodes disposed between the ground select line GSL and the string select lines SSL, among the gate electrodes 70, may include n word lines (WL1 to WLn of FIG. 2) described above. In one embodiment, n word lines (WL1 to WLn of FIG. 2) may be referred to as word lines WL. The word lines WL may be divided on the first area A1 by the cell secondary separation pattern ASc and may be divided on the second area A2 by the first secondary separation pattern ASa and the second secondary separation patterns ASb. The memory cells (MC1 to MCn of FIG. 2) may be disposed on the first area A1.

In an example embodiment, a gate electrode disposed between the word lines WL and the string select line SSL, among the gate electrodes 70, may be provided as the buffer line (BUL of FIG. 2) described above.

The gate electrodes 70 may have exposed end portions. The exposed end portions of the gate electrodes 70 may be defined as pad portions. The pad portions of the gate electrodes 70 may be provided as portions, a thickness of which is greater than that of the gate electrodes 70. For example, they may be described as raised portions.

Exposed pad portions 70s of gate electrodes corresponding to the string select lines SSL, among the gate electrodes 70, may be disposed at the same level, for example, at a uniform height from the surface 10s of the substrate 10. An exposed pad portion 70f of a gate electrode corresponding to the buffer line BUL, among the gate electrodes 70, may be disposed at a uniform height from the surface 10s of the substrate 10.

A portion of or an entirety of the gate electrodes 70 disposed between the buffer line BUL and the substrate 10 may form stacked gate groups SG.

Each of the stacked gate groups SG may include a plurality of gate electrodes 70. For example, each of the stacked gate groups SG may include a plurality of word lines WL.

Pad portions 70p of the gate electrodes 70 of a lower stacked gate group SGb disposed in a relatively lower portion among the stacked gate groups SG may protrude in the first direction (the X direction) further than pad portions 70p of the gate electrodes 70 of an upper stacked gate group SGa disposed in a relatively higher portion among the stacked gate groups SG. For example, the pad portions 70p of the gate electrodes 70 of each of the stacked gate groups SG may be arranged to have a stepped structure formed downwardly to have a height difference between adjacent pads in the first direction (the X direction) of a first height Hc in the first direction (the X direction). For example, the pad portions 70p of adjacent stacked gate groups SG may be arranged to have the stepped structure formed downwardly (e.g., starting with pad portions 70p closest to the string select line SSL) so that adjacent pad portions 70p in the X direction have a height difference of the first height Hc in the first direction (the X direction) from the first area A1.

The main separation patterns MS may include a first main separation pattern MS1 and second main separation patterns MS2 disposed on either side of the first main separation pattern MS1. For example, the first main separation pattern MS1 may be disposed between the second main separation patterns MS2. As described above, the pad portions 70p of the gate electrodes 70 of each stacked gate group SG may be arranged to have the stepped structure formed between adjacent pad portions 70p to have a second height difference Hb in the second direction (the Y direction) between adjacent pad portions 70p. For example, when traversing in the Y direction from a pad portion 70p labeled 70p-1 to a pad portion 70p-n, each subsequent adjacent pad portion may have a height difference of Hb that increases until one or more middle pad portions are reached, after which point, each subsequent adjacent pad portion may have a height difference of Hb that decreases until the pad portion 70p-n. The adjacent pad portions 70p in the first direction (the X direction) of the gate electrodes 70 forming adjacent stacked gate groups SG may be arranged to have a stepped structure formed downwardly by the first height Hc that is greater than the second height Hb between adjacent pad portions 70p of a single stacked gate group SG in a direction from the first main separation pattern MS1 to the second main separation pattern MS2 in the second direction (e.g., the Y direction) perpendicular to the first direction, where both the first direction and second direction are parallel to the surface 10s of the substrate 10. The second height Hb and the first height Hc refer to a relative difference in heights. The terms "first height" and "second height" are used as labels and may be interchangeable with each other.

A step shown by the second height Hb of the pad portions 70p of the gate electrodes 70 of each stacked gate group SG in the second direction (the Y direction) may have a smaller height than a step shown by the first height Hc of the pad portions 70p of the gate electrodes 70 of the stacked gate groups SG in the first direction (the X direction). For example, the first height Hc corresponds to a distance in the third direction (the Z direction) between a top surface of a pad portion of the pad portions 70p of the gate electrodes 70 of the lower stacked gate group SGb and a top surface of a corresponding pad portion of the pad portions 70p of the gate electrodes 70 of the upper stacked gate group SGa extending in the first direction (the X direction). The second height Hb corresponds to a distance in the third direction (the Z direction) between top surfaces of adjacent pad portions 70p of the gate electrodes 70 of the lower stacked gate group SGb or the upper stacked gate group SGa extending in the second direction (the Y direction). In some embodiments, the distance of the first height Hc in the third direction (the Z direction) between two pad portions 70p adjacent to each other in the first direction (the X direction) is greater than the distance of the second height Hb in the third direction (the Z direction) between two pad portions 70p adjacent to each other in the second direction (the Y direction).

A step shown by the first height Hc of the pad portions 70p of the gate electrodes 70 of the stacked gate groups SG in the first direction (the X direction) may be greater than a step shown by a third height Ha between the string select line SSL disposed at a higher level than the stacked gate groups SG and the pad portions 70p of the buffer line BUL disposed on a lower portion of the string select line SSL in the first direction (the X direction).

Figure 6:
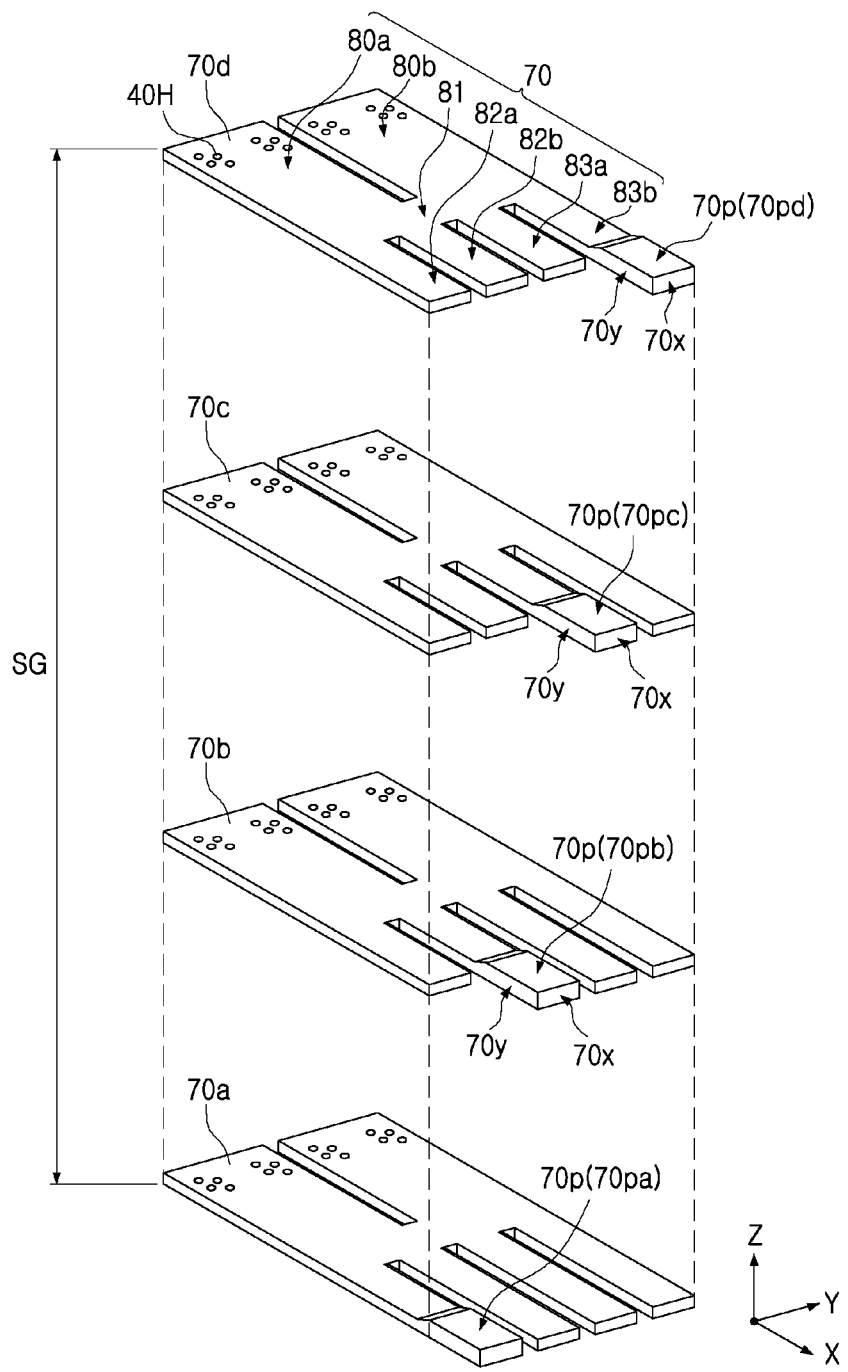
FIG. 6 is an exploded perspective view of a component of FIG. 5.

Any stacked gate group SG among the stacked gate groups SG will be described with reference to FIG. 6. FIG. 6 is an exploded perspective view of a component of FIG. 5.

With reference to FIG. 6, any single stacked gate group SG among the stacked gate groups SG may include the plurality of gate electrodes 70 sequentially arranged in the third direction (the Z direction) and disposed to be spaced apart from each other.

Each of the gate electrodes 70 forming the stacked gate group SG may include a first cell gate portion 80a, a second cell gate portion 80b, a first gate extension portion 82a, a second gate extension portion 82b, a third gate extension portion 83a, a fourth gate extension portion 83b, and a gate connection portion 81.

The first cell gate portion 80a and the second cell gate portion 80b may be separated by the cell secondary separation pattern (ASc of FIG. 4) to be disposed to be spaced apart from each other.

The first gate extension portion 82a and the second gate extension portion 82b may be extended from the first cell gate portion 80a. The first gate extension portion 82a and the second gate extension portion may be separated by any of the second secondary separation patterns (ASb of FIG. 4) to be disposed to be spaced apart from each other.

The third gate extension portion 83a and the fourth gate extension portion 83b may be extended from the second cell gate portion 80b. The third gate extension portion 83a and the fourth gate extension portion 83b may be separated by any of the second secondary separation patterns (ASb of FIG. 4) to be disposed to be spaced apart from each other.

The second gate extension portion 82b and the third gate extension portion 83a disposed adjacent to each other may be separated by the first secondary separation pattern (ASa of FIG. 4) to be disposed to be spaced apart from each other.

The gate connection portion 81 may connect the first cell gate portion 80a and the second cell gate portion 80b to the first gate extension portion 82a, the second gate extension portion 82b, the third gate extension portion 83a, and the fourth gate extension portion 83b.

The gate electrodes 70 may include the pad portions 70p. For example, the first gate extension portion 82a, the second gate extension portion 82b, the third gate extension portion 83a, and the fourth gate extension portion 83b of the gate electrodes 70 may include the pad portions 70p.

The pad portions 70p may not overlap each other. The gate electrodes 70 may include a first pad portion 70pa, a second pad portion 70pb, a third pad portion 70pc, and a fourth pad portion 70pd, formed on end portions of a first gate electrode 70a, a second gate electrode 70b, a third gate electrode 70c, and a fourth gate electrode 70d. Thus, the number of the pad portions 70p in a single stacked gate group SG may be equal to that of stacked gate electrodes forming the stacked gate group SG.

The first cell gate portion 80a, the second cell gate portion 80b, the first gate extension portion 82a, the second gate extension portion 82b, the third gate extension portion 83a, the fourth gate extension portion 83b, and the gate connection portion 81 may have substantially the same thickness. The pad portion 70p may be thicker than each of the first cell gate portion 80a, the second cell gate portion 80b, the first gate extension portion 82a, the second gate extension portion 82b, the third gate extension portion 83a, the fourth gate extension portion 83b, and the gate connection portion 81.

An uppermost fourth gate electrode 70d among the first gate electrode 70a, the second gate electrode 70b, the third gate electrode 70c, and the fourth gate electrode 70d, forming each of the stacked gate group SG, may include the fourth pad portion 70pd formed on an end portion of the fourth gate extension portion 83b. The fourth gate extension portion 83b of the first gate electrode 70a, the second gate electrode 70b, and the third gate electrode 70c may be disposed below the fourth pad portion 70pd of the fourth gate electrode 70d.

The third gate electrode 70c may include the third pad portion 70pc formed on an end portion of the third gate extension portion 83a. The third gate extension portion 83a of the first gate electrode 70a and the second gate electrode 70b may be disposed below the third pad portion 70pc of the third gate electrode 70c.

The second gate electrode 70b may include the second pad portion 70pb formed on an end portion of the second gate extension portion 82b. The second gate extension portion 82b of the first gate electrode 70a may be disposed below the second pad portion 70pb of the second gate electrode 70b.

The first gate electrode 70a may include the first pad portion 70pa formed on an end portion of the first gate extension portion 82a. Each of the pad portions 70p may include a first side 70x disposed in the first direction (the X direction) and a second side 70y disposed in the second direction (the Y direction).

Figure 7A:
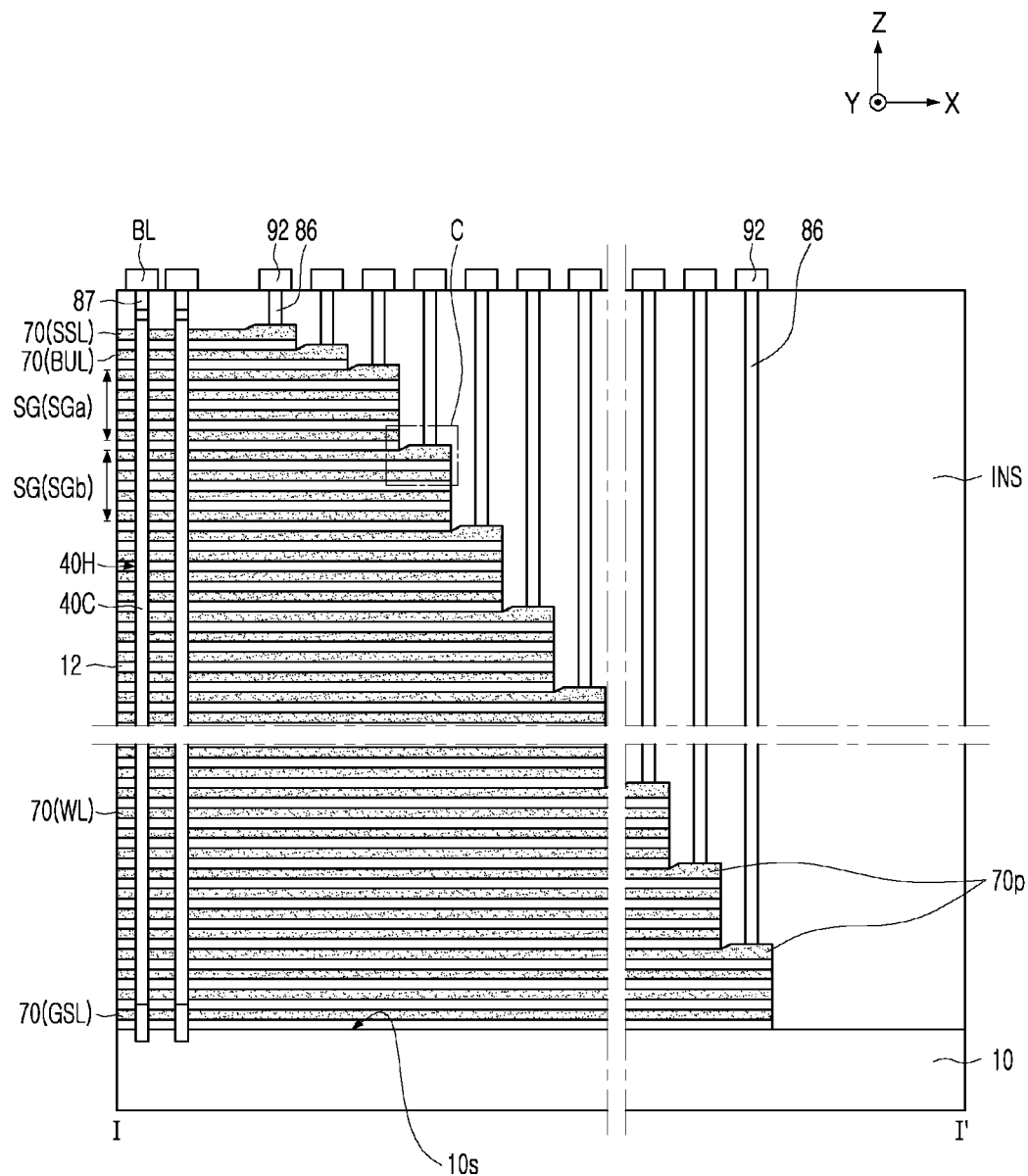
FIG. 7A is a cross-sectional view taken along line I-I' of FIG. 4.
Figure 7B:
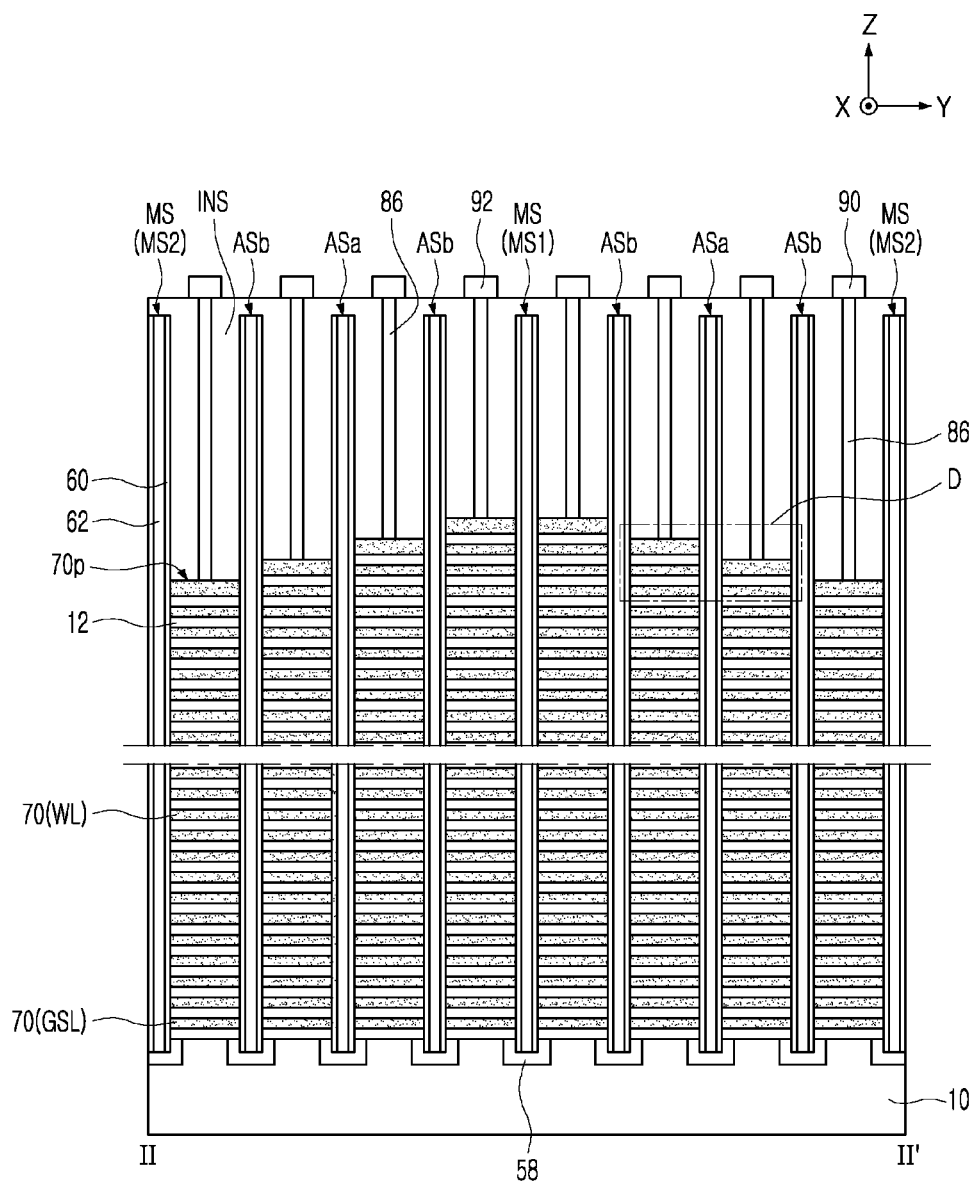
FIG. 7B is a cross-sectional view taken along line II-IF of FIG. 4.
Figure 7C:
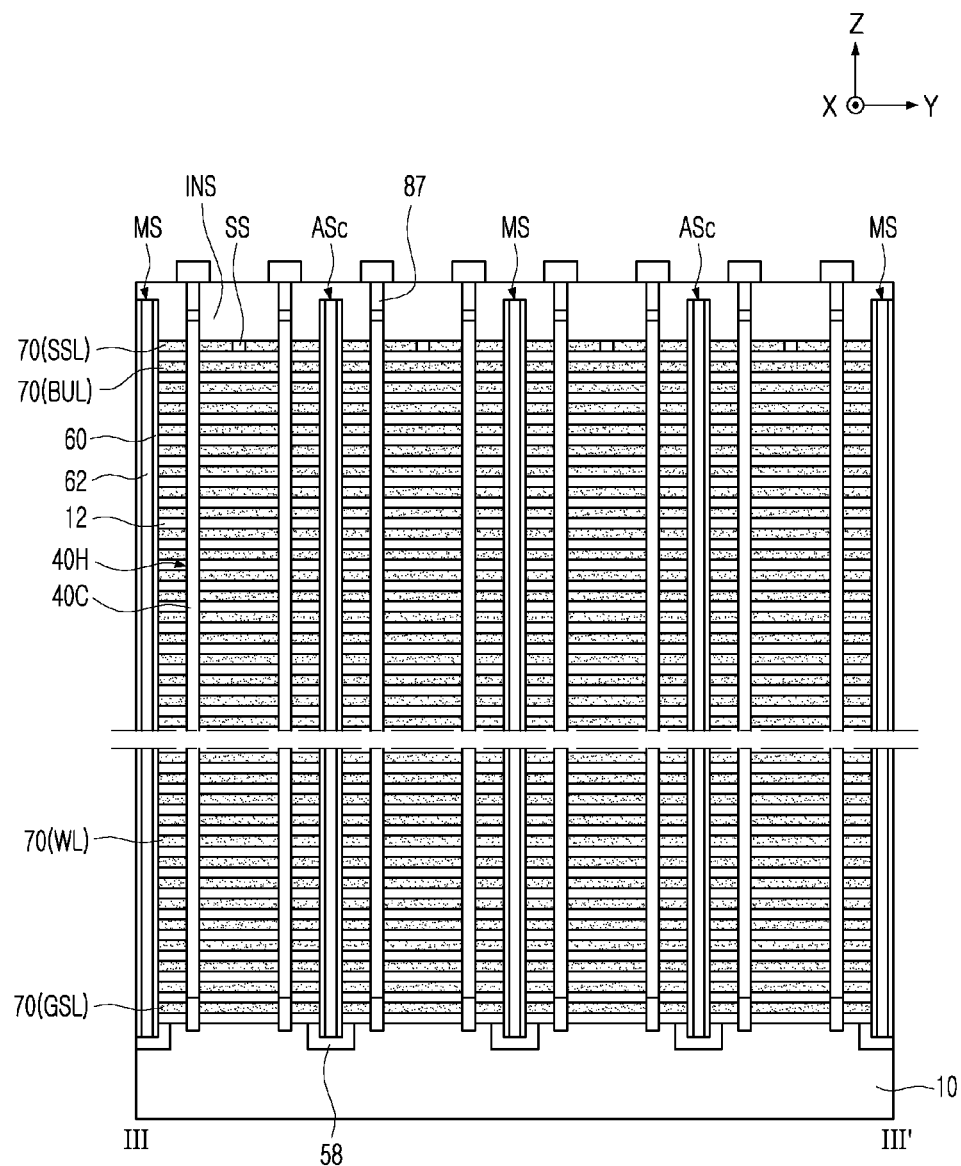
FIG. 7C is a cross-sectional view taken along line of FIG. 4.

Channel structures (40C of FIG. 4) may be disposed on the first area A1 of the substrate 10. The channel structures 40C may be disposed in channel holes 40H penetrating through the gate electrodes 70 and the interlayer insulating layers 12. With reference to FIGS. 7A, 7B, and 7C, bit line contact plugs electrically connected to the channel structures (40C of FIG. 4), gate contact plugs electrically connected to the gate electrodes 70, the bit lines BL and gate lines electrically connected to the bit line contact plugs and the gate contact plugs described above, the main separation patterns MS, the ASa, the second secondary separation patterns ASb, and the cell secondary separation pattern ASc will be described. FIG. 7A is a cross-sectional view taken along line I-I' of FIG. 4, FIG. 7B is a cross-sectional view taken along line II-IF of FIG. 4, and FIG. 7C is a cross-sectional view taken along line of FIG. 4.

With reference to FIGS. 7A, 7B, and 7C, bit line contact plugs 87 which may be electrically connected to the channel structures 40C may be disposed on the channel structures 40C. Gate contact plugs 86 electrically connected to the pad portions 70p may be disposed on the pad portions 70p of the gate electrodes 70. A capping insulating structure INS covering the gate electrodes 70 may be disposed on the substrate 10. Side surfaces of the gate contact plugs 86 may be surrounded by the capping insulating structure INS.

The bit lines BL electrically connected to the bit line contact plugs 87 may be disposed on the bit line contact plugs 87. Gate lines 92 which may be electrically connected to the gate contact plugs 86 may be disposed on the gate contact plugs 86. The gate contact plugs 86 and the bit line contact plugs 87 may be, for example, conductive plugs formed of a conductive material such as a metal.

The main separation patterns MS, the first secondary separation pattern ASa, the second secondary separation patterns ASb, and the cell secondary separation pattern ASc may penetrate through the gate electrodes 70 and the interlayer insulating layers 12 to be extended to an interior of the capping insulating structure INS. Each of the main separation patterns MS, the first secondary separation pattern ASa, the second secondary separation patterns ASb, and the cell secondary separation pattern ASc may include a core portion 62 and a spacer portion 60 a covering side surface of the core portion 62.

In an example embodiment, the core portion 62 may be formed using a conductive material (e.g., polysilicon, tungsten (W), a metallic nitride, or the like). The spacer portion 60 may be formed using an insulating material (e.g., a silicon oxide, or the like).

An impurity area 58 may be disposed below the core portion 62 in the substrate 10. The impurity area 58 may be formed using a material having a conductivity type different from that of an area of the substrate 10 disposed adjacent to the impurity area 58. For example, the impurity area 58 may have n-type conductivity, while the area of the substrate 10 disposed adjacent to the impurity area 58 may have p-type conductivity. The impurity area 58 may be provided as the common source line (CSL of FIG. 2). The impurity area 58 may be electrically connected to the core portion 62.

Figure 8:
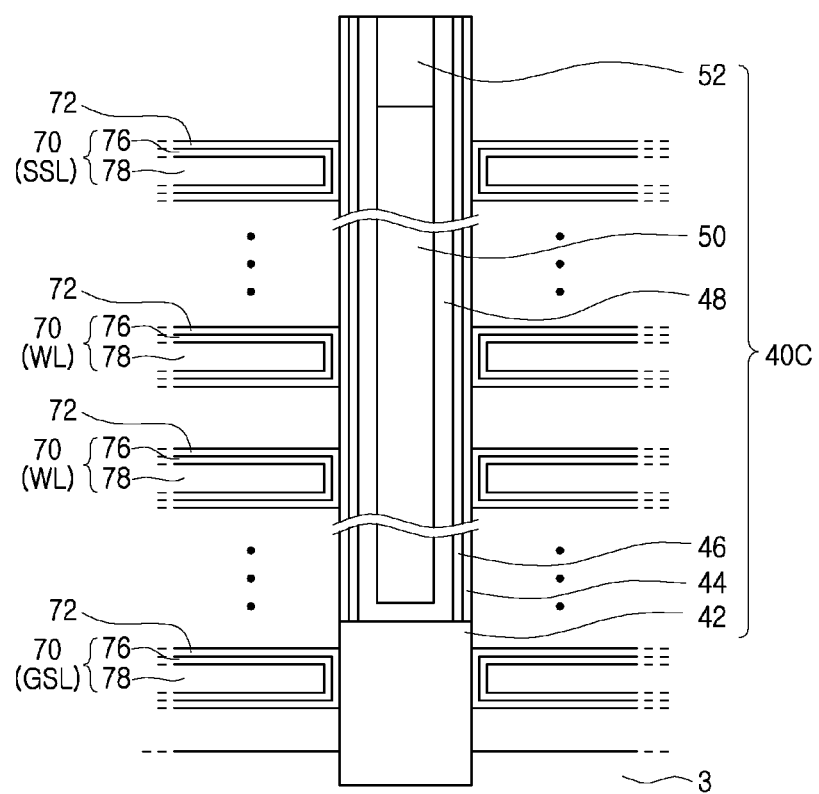
FIG. 8 is a schematic cross-sectional view of a component of a three-dimensional semiconductor device according to an example embodiment.

The channel structures 40C may be disposed in the channel holes 40H extending in the third direction (the Z direction) perpendicular to the surface 10s of the substrate 10 and penetrating through the gate electrodes 70 and the interlayer insulating layers 12. An example of the channel structures 40C will be described with reference to FIG. 8. FIG. 8 is a schematic cross-sectional view of a component of a three-dimensional semiconductor device according to an example embodiment.

With reference to FIG. 8, each of the channel structures 40C may include a semiconductor pattern 42, a core pattern 50, a pad pattern 52, a semiconductor layer 48, a first dielectric layer 46, and an information storage layer 44. The semiconductor pattern 42 may be in contact with the substrate 10. The semiconductor pattern 42 may have a side surface facing a gate electrode 70 acting as the ground select line GSL. The semiconductor pattern 42 may be disposed at a level lower than that of gate electrodes 70 which may act as the word lines WL. The semiconductor pattern 42 may be provided as an epitaxial material layer which may be formed using a selective epitaxial growth (SEG) process. For example, the semiconductor pattern 42 may be formed using single crystal silicon.

The core pattern 50 may be disposed on the semiconductor pattern 42 and may be formed using an insulating material (e.g., a silicon oxide, or the like). The pad pattern 52 may be disposed on the core pattern 50. The pad pattern 52 may have n-type conductivity and may be provided as a drain terminal of a transistor. The pad pattern 52 may be formed using polysilicon. The pad pattern 52 may be disposed at a level higher than that of an uppermost gate electrode 70 which may act as the string select line SSL.

The semiconductor layer 48 may cover a side surface and a bottom surface of the core pattern 50. The core pattern 50 and the semiconductor layer 48 may penetrate through the string select line SSL and the word lines WL. The semiconductor layer 48 may be in contact with the semiconductor pattern 42. The semiconductor layer 48 may be referred to as a channel layer. The semiconductor layer 48 may be formed using a polysilicon layer. The semiconductor layer 48 may be extended on a side surface of the pad pattern 52.

The first dielectric layer 46 may be disposed on an external side surface of the semiconductor layer 48. The information storage layer 44 may be interposed between the first dielectric layer 46 and the gate electrodes 70. A second dielectric layer 72 disposed on an upper surface and a lower surface of the gate electrodes 70 and extending between the channel structures 40C and the gate electrodes 70 may be disposed.

The first dielectric layer 46 may be provided as a tunnel dielectric. The first dielectric layer 46 may include a silicon oxide and/or an impurity-doped silicon oxide. The information storage layer 44 may be provided as a layer for storing information in a non-volatile memory device, such as a flash memory device, or the like. For example, the information storage layer 44 may be formed using a material, such as a silicon nitride, trapping and retaining an electron injected from the semiconductor layer 48 through the first dielectric layer 46, according to operating conditions of the non-volatile memory device, such as a flash memory device, or erasing an electron trapped in the information storage layer 44. The second dielectric layer 72 may be formed to include a high-k dielectric (e.g., an aluminum oxide (AlO), or the like). The second dielectric layer 72 may be provided as a blocking dielectric.

Each of the gate electrodes 70 may include a first conductive layer 76 and a second conductive layer 78. The first conductive layer 76 may cover an upper surface and a lower surface of the second conductive layer 78 to extend between the second conductive layer 78 and the channel structures 40C.

Figure 9:
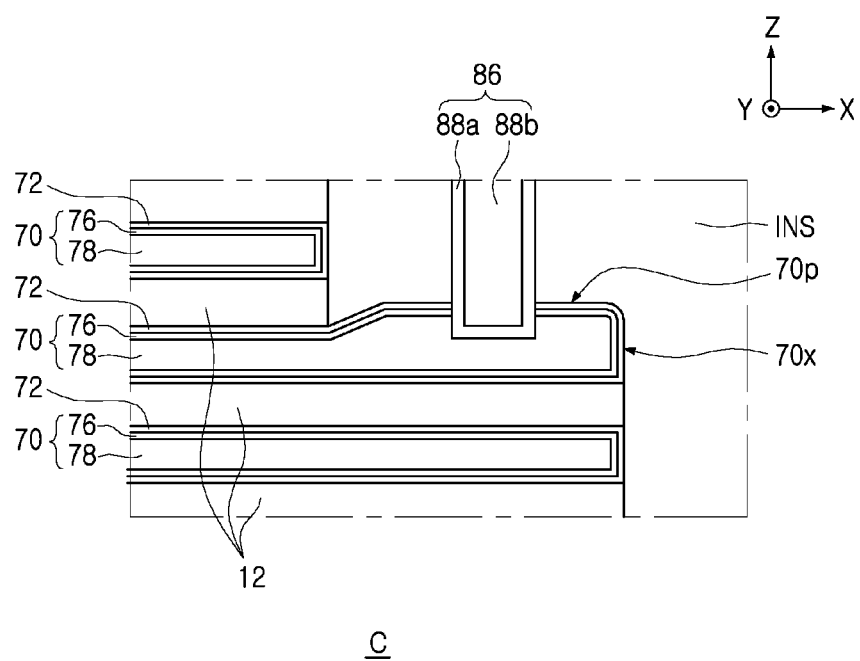
FIG. 9 is a partially enlarged view of area "C" of FIG. 7A.

The pad portions 70*p* of the gate electrodes 70 and the gate contact plugs 86 will be described with reference to FIGS. 9 and 10. FIG. 9 is a partially enlarged view of area "C" of FIG. 7A, while FIG. 10 is a partially enlarged view of area "D" of FIG. 7B.

Figure 10:
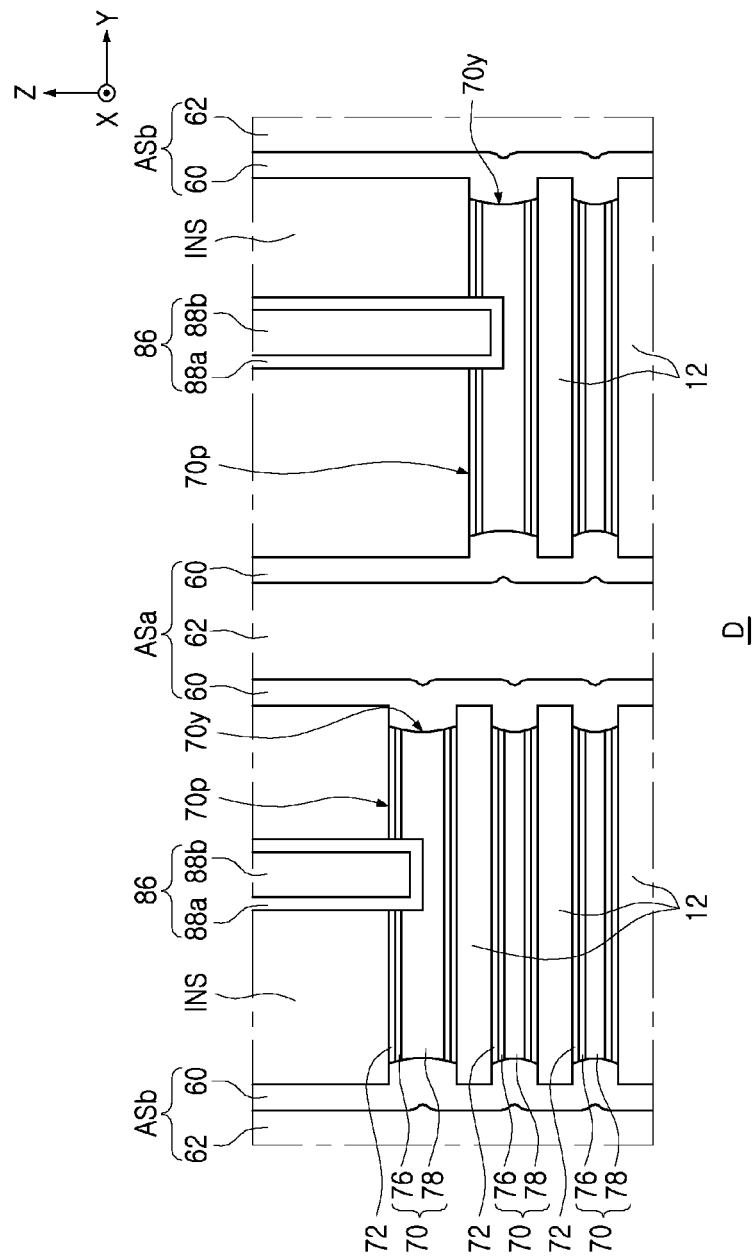
FIG. 10 is a partially enlarged view of area "D" of FIG. 7B.

With reference to FIGS. 9 and 10, as described in FIG. 6, each of the pad portions 70*p* may include a first side 70*x* disposed in the first direction (the X direction) and a second side 70*y* disposed in the second direction (the Y direction). In addition, as described above, the pad portions 70*p* may be provided as portions, a thickness in the third direction (the Z direction) of which is greater than a thickness in the third direction (the Z direction) of the gate electrodes 70.

The gate contact plugs 86 may be in contact with an upper surface of the pad portions 70*p* to extend to an interior of the pad portions 70*p*. The gate contact plugs 86 may include a barrier layer 88*a* and a plug layer 88*b*. The barrier layer 88*a* may be disposed to surround a side surface and a bottom surface of the plug layer 88*b* having a pillar form. The barrier layer 88*a* may include a metallic nitride (e.g., titanium nitride (TiN), or the like), while the plug layer 88*b* may include a metal (e.g., W, or the like).

The gate contact plugs 86 may penetrate through the first conductive layer 76 of the pad portions 70*p* to extend to an interior of the second conductive layer 78. The first conductive layer 76 may be formed using a barrier metal (e.g., TiN, or the like), while the second conductive layer 78 may be formed using a metal (e.g., W, or the like) having better electrical characteristics than that of the first conductive layer 76. Thus, since the gate contact plugs 86 may be in direct contact with the second conductive layer 78, and an area in which the gate contact plugs 86 are in contact with the second conductive layer 78 may be increased, a level of resistance between the gate contact plugs 86 and the pad portions 70*p* may be reduced. Thus, according to example embodiments, the three-dimensional semiconductor device having improved resistance characteristics may be provided. In addition, since the pad portions 70*p* having an increased thickness may be in stable contact with the gate contact plugs 86, reliability and durability of the three-dimensional semiconductor device according to example embodiments may be improved.

As described above, each of the main separation patterns MS, the first secondary separation pattern ASa, the second secondary separation patterns ASb, and the cell secondary separation pattern ASc may include the core portion 62 and the spacer portion 60 covering the side surface of the core portion 62. The gate electrodes 70 disposed adjacent to the spacer portion 60 and the interlayer insulating layers 12 together with the core portion 62 and the spacer portion 60, described above, will be described with reference to FIG. 10.

With reference to FIG. 10, the spacer portion 60 may protrude in a direction of the gate electrodes 70. End portions of the gate electrodes 70 may be recessed further than the interlayer insulating layers 12 in the second direction (the Y direction). Thus, among the main separation patterns MS, the first secondary separation pattern ASa, the second secondary separation patterns ASb, and the cell secondary separation pattern ASc, a width of the gate electrodes 70 between two separation patterns disposed adjacent to each other may be narrower than that of the interlayer insulating layers 12.

Figure 11:
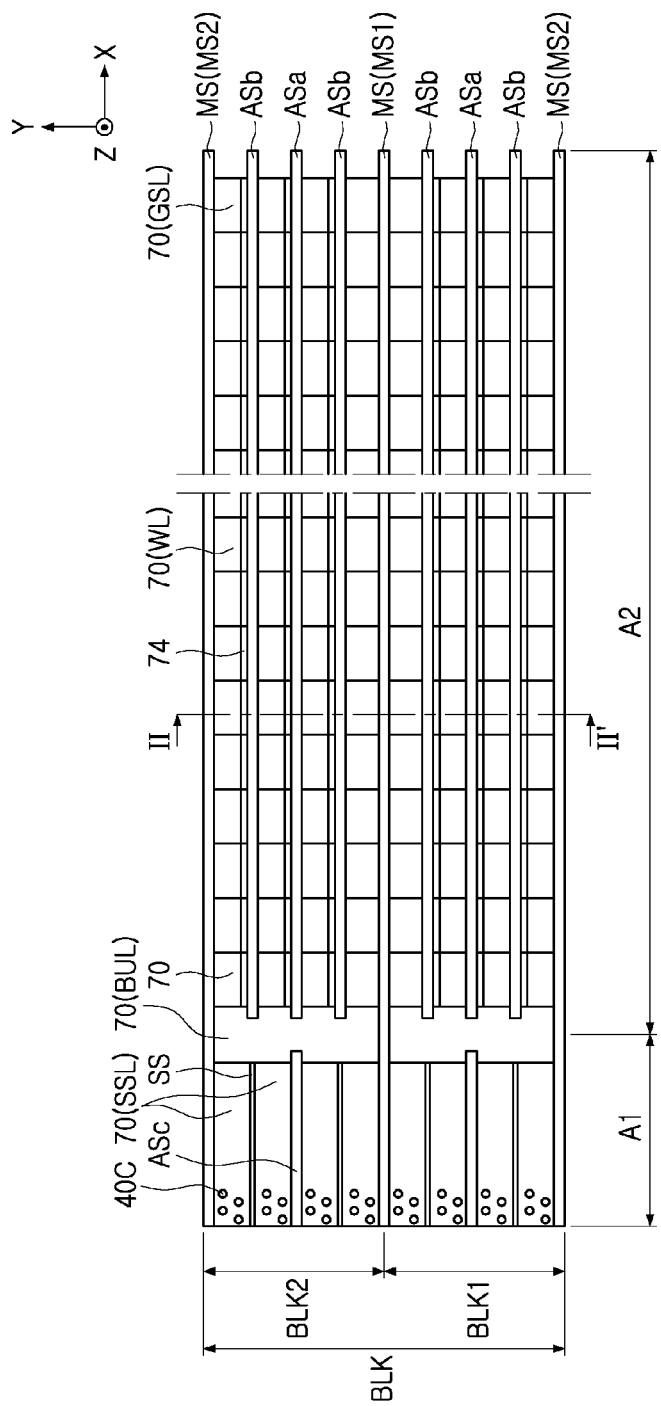
FIG. 11 is a schematic top view of a component of a three-dimensional semiconductor device according to a modified example embodiment.
Figure 12:
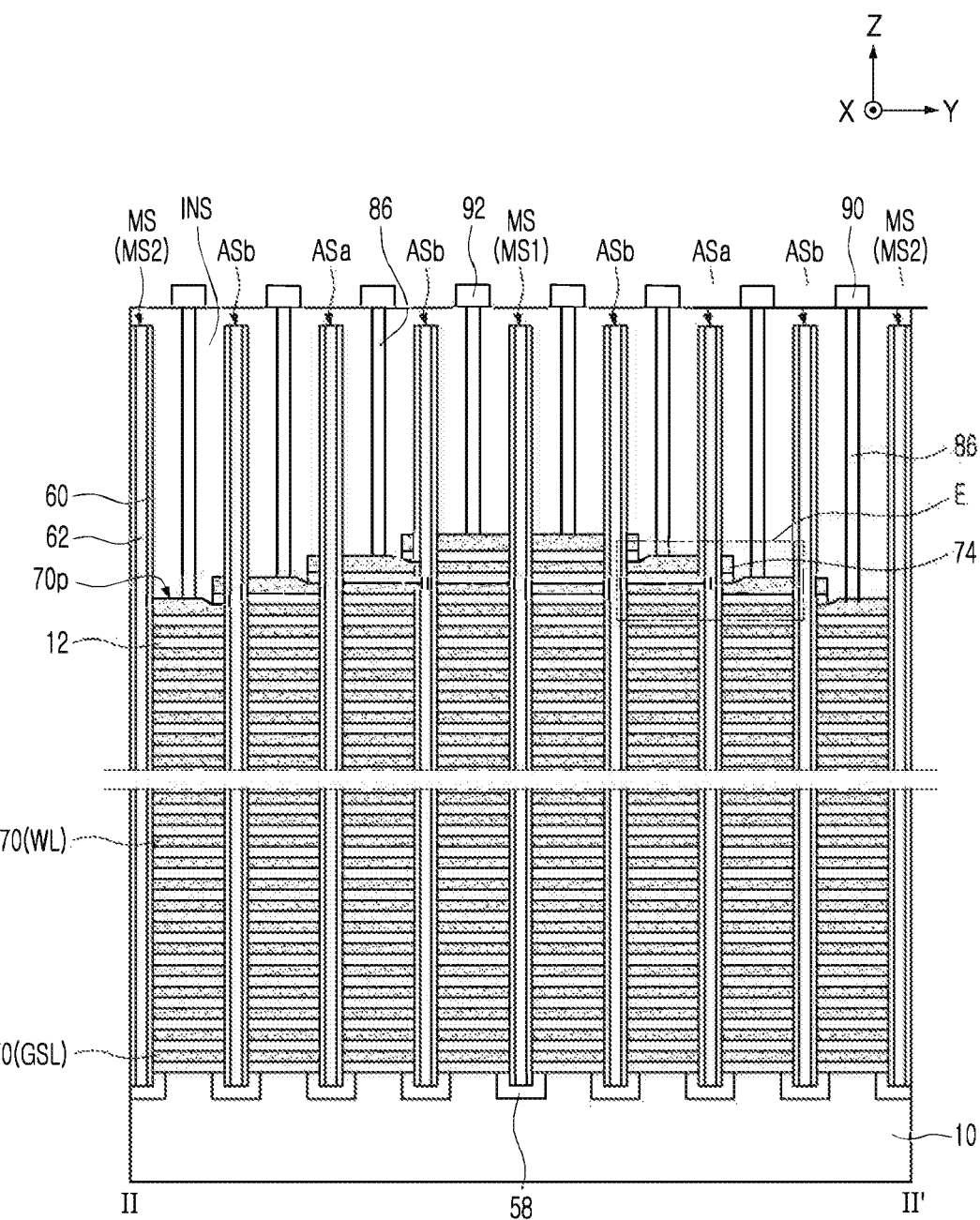
FIG. 12 is a cross-sectional view taken along line II-IF of FIG. 11.
Figure 13:
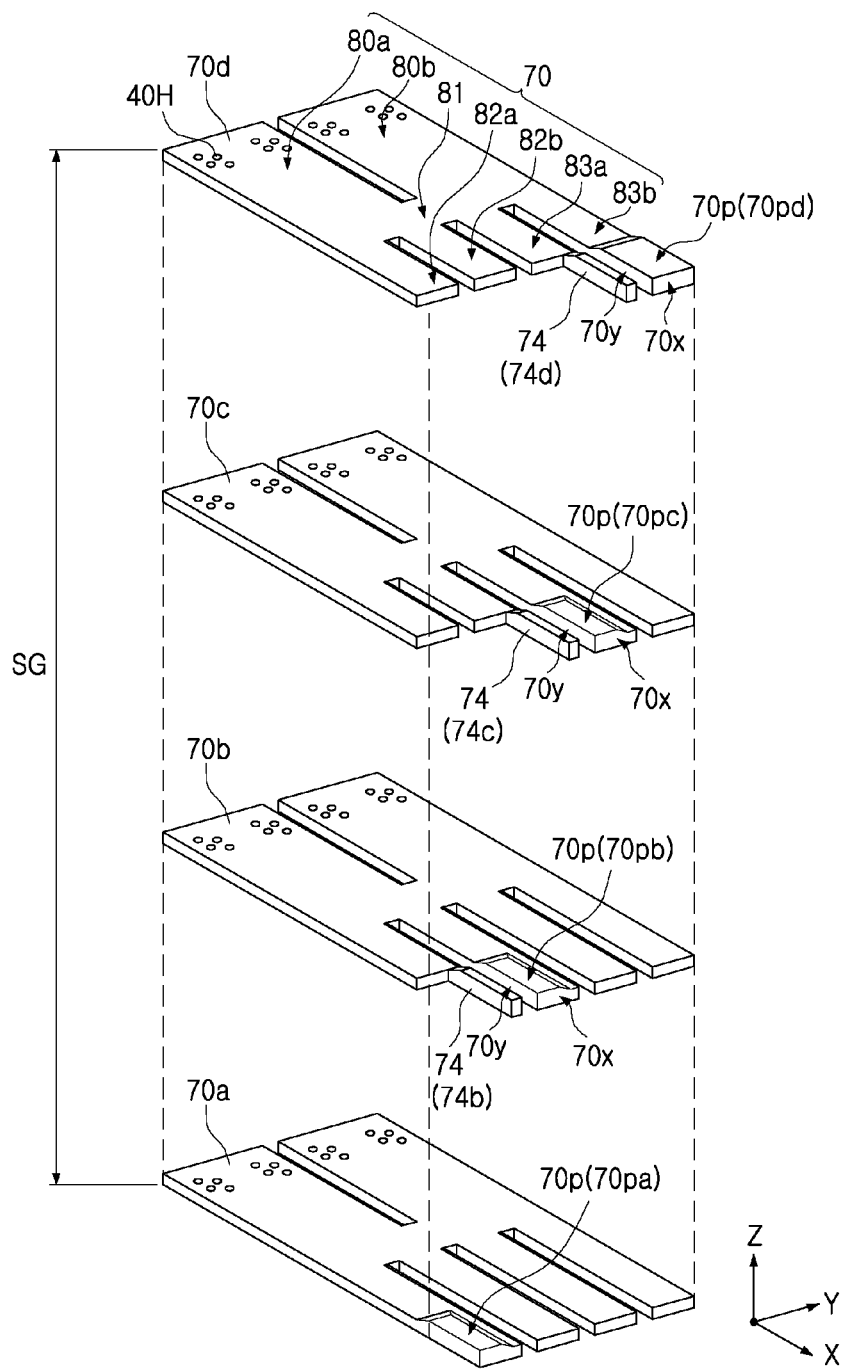
FIG. 13 is a schematic, exploded perspective view of a component of a three-dimensional semiconductor device according to a modified example embodiment.
Figure 14A:
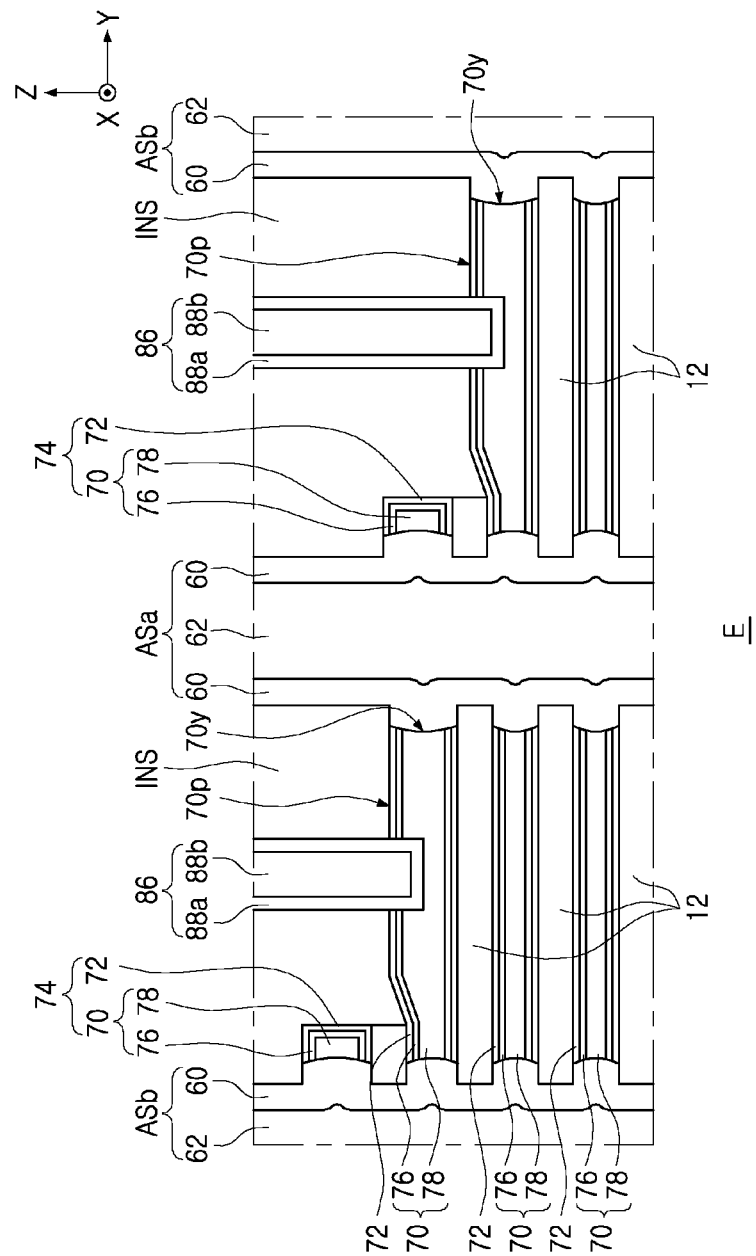
FIG. 14A is a partially enlarged view of an example of a three-dimensional semiconductor device according to a modified example embodiment.
Figure 14B:
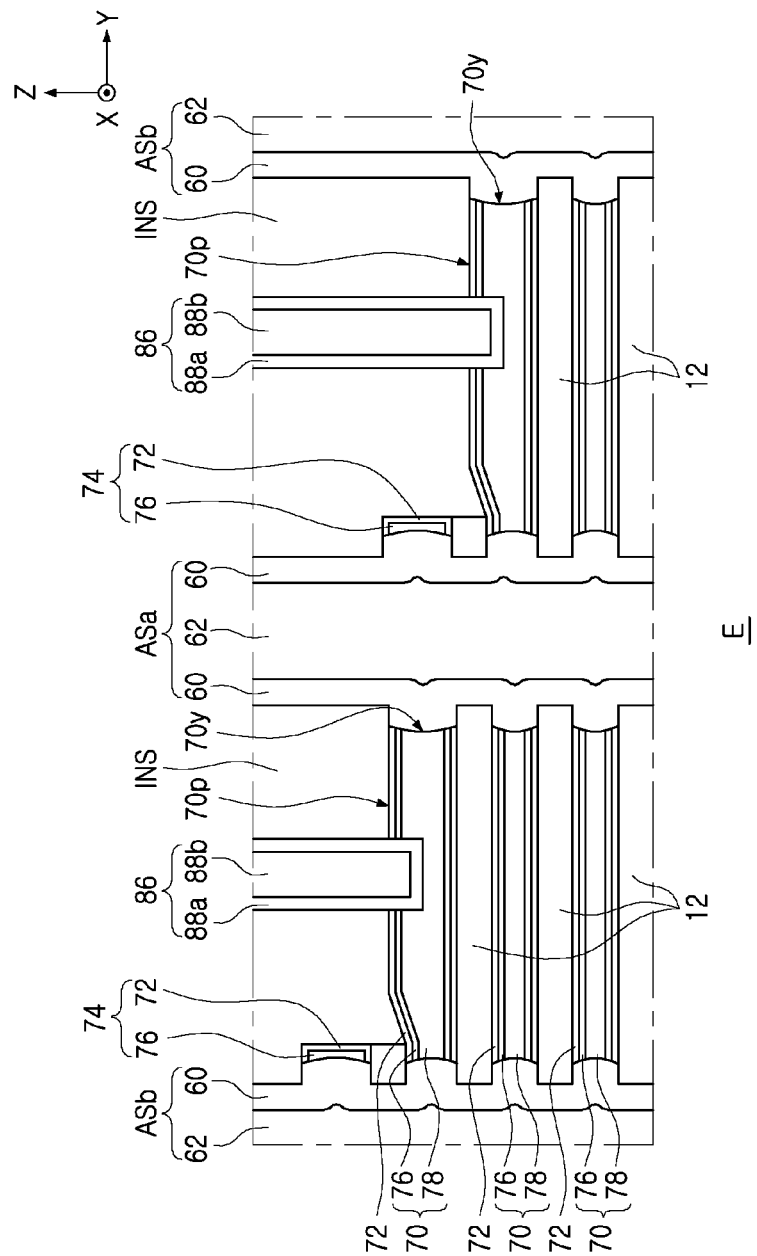
FIG. 14B is a partially enlarged view of a modified example of a three-dimensional semiconductor device according to a modified example embodiment.
Figure 14C:
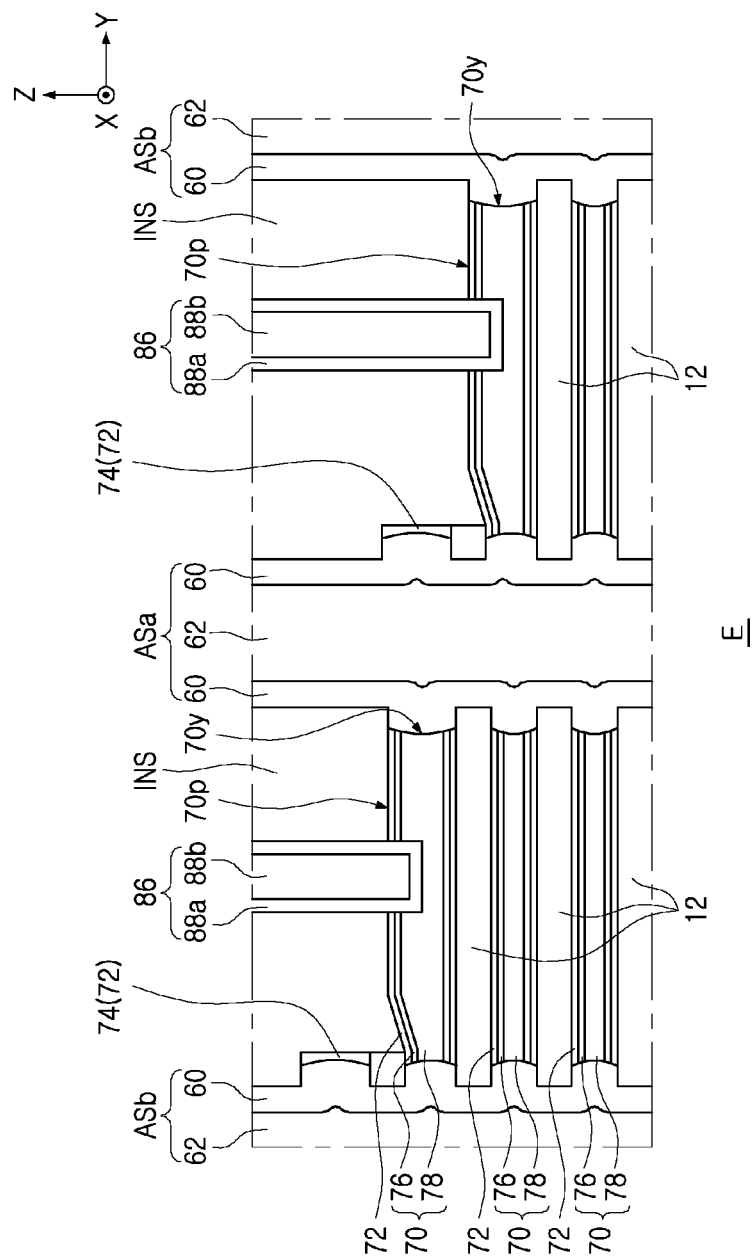
FIG. 14C is a partially enlarged view of another modified example of a three-dimensional semiconductor device according to a modified example embodiment.

According to an example embodiment, among the gate electrodes 70, disposed between the first secondary separation pattern ASa and the second secondary separation patterns ASb and disposed below the buffer line BUL, an exposed portion of a gate electrode or a portion of an uppermost gate electrode may be provided as the pad portions 70*p*, but the present disclosure is not limited thereto. For example, a portion of the gate electrodes 70 may include protruding portions. Among gate electrodes 70 disposed between the first secondary separation pattern ASa and the second secondary separation patterns ASb and disposed below the buffer line BUL, a portion of the uppermost gate electrode may be provided as the protruding portions of the gate electrodes 70. The protruding portions of the gate electrodes 70 will be described with reference to FIGS. 11 to 14C. FIG. 11 is a schematic top view of a component of a three-dimensional semiconductor device according to a modified example embodiment; FIG. 12 is a cross-sectional view taken along line II-IF of FIG. 11; FIG. 13 is a schematic, exploded perspective view of a component of a three-dimensional semiconductor device according to a modified example embodiment; FIG. 14A is a partially enlarged view of an example of a three-dimensional semiconductor device according to a modified example embodiment; FIG. 14B is a partially enlarged view of a modified example of a three-dimensional semiconductor device according to a modified example embodiment; and FIG. 14C is a partially enlarged view of another modified example of a three-dimensional semiconductor device according to a modified example embodiment. Since the remainder of components except for the protruding portions of gate electrodes 70 in FIGS. 11 to 14C are the same as described in FIGS. 1 to 10, descriptions provided in FIGS. 1 to 10 will be omitted. Thus, components not separately described in FIGS. 11 to 14C may be construed as components described in FIGS. 1 to 10.

With reference to FIGS. 11 and 12, a portion of the gate electrodes 70 may have protruding portions 74 in contact with a first secondary separation pattern ASa and second secondary separation patterns ASb. For example, the gate electrodes 70 forming stacked gate groups SG as described in FIG. 5 may have the protruding portions 74. The protruding portions 74 of the gate electrodes 70 may be disposed to be spaced apart from main separation patterns MS.

As described above, the main separation patterns MS may include a first main separation pattern MS1 and second main separation patterns MS2. In the gate electrodes 70 which may form the stacked gate groups SG, pad portions 70*p* of the gate electrodes 70 may be arranged to have a stepped structure formed downwardly in a direction from the first main separation pattern MS1 to the second main separation patterns MS2.

The protruding portions 74 of the gate electrodes 70 forming the stacked gate groups SG disposed between two main separation patterns MS disposed adjacent to each other may be in contact with the first secondary separation pattern ASa and the second secondary separation patterns ASb disposed between the two main separation patterns MS. The protruding portions 74 of the gate electrodes 70 in contact with the first secondary separation pattern ASa and the second secondary separation patterns ASb, described above, may be in contact with side surfaces of the first secondary separation pattern ASa and the second secondary separation patterns ASb facing the second main separation patterns MS2. The pad portions 70*p* of the gate electrodes 70 may be in contact with the side surfaces of the first secondary separation pattern ASa and the second secondary separation patterns ASb, facing the first main separation pattern MS1.

Gate electrodes 70 forming any stacked gate group SG among the stacked gate groups SG will be described with reference to FIG. 13. The gate electrodes 70 of FIG. 13 will be described based on a first gate electrode 70*a*, a second gate electrode 70*b*, a third gate electrode 70*c*, and a fourth gate electrode 70*d*, described in FIG. 6.

With reference to FIG. 13, as described in FIG. 6, a single stacked gate group SG may include the first gate electrode 70*a*, the second gate electrode 70*b*, the third gate electrode 70*c*, and the fourth gate electrode 70*d*. Among the first gate electrode 70*a*, the second gate electrode 70*b*, the third gate electrode 70*c*, and the fourth gate electrode 70*d*, a lowermost first gate electrode 70*a* may not include the protruding portions 74, while the second gate electrode 70*b*, the third gate electrode 70*c*, and the fourth gate electrode 70*d* on the first gate electrode 70*a* may include the protruding portions 74.

An uppermost fourth gate electrode 70*d* among the first gate electrode 70*a*, the second gate electrode 70*b*, the third gate electrode 70*c*, and the fourth gate electrode 70*d*, forming the single stacked gate group SG, may include a fourth pad portion 70*pd* formed on an end portion of a fourth gate extension portion 83*b* and a protruding portion 74*d* formed to be extended from a portion of a third gate extension portion 83*a* in a first direction (an X direction).

The third gate electrode 70*c* may include a third pad portion 70*pc* formed on an end portion of the third gate extension portion 83*a* and a protruding portion 74*c* extended from a portion of a second gate extension portion 82*b*.

The second gate electrode 70*b* may include a second pad portion 70*pb* formed on an end portion of the second gate extension portion 82*b* and a protruding portion 74*b* extended from a portion of a first gate extension portion 82*a*.

Thus, the protruding portions 74*b*, 74*c*, and 74*d* may be disposed to be spaced apart from pad portions 70*pb*, 70*pc*, and 70*pd* of the second gate electrode 70*b*, the third gate electrode 70*c*, and the fourth gate electrode 70*d* and may be connected to the second gate electrode 70*b*, the third gate electrode 70*c*, and the fourth gate electrode 70*d*.

In terms of the protruding portions 74*b*, 74*c*, and 74*d* and the pad portions 70*pb*, 70*pc*, and 70*pd*, widths thereof may be the same in the first direction (the X direction). For example, widths of the protruding portions 74*b*, 74*c*, and 74*d* in the first direction (the X direction) may be the same as those of the pad portions 70*pb*, 70*pc*, and 70*pd* in the first direction (the X direction). In terms of the protruding portions 74*b*, 74*c*, and 74*d* and the pad portions 70*pb*, 70*pc*, and 70*pd*, widths thereof may be different in a second direction (a Y direction). For example, widths of the pad portions 70*pb*, 70*pc*, and 70*pd* in the second direction (the Y direction) may be greater than those of the protruding portions 74*b*, 74*c*, and 74*d* in the second direction (the Y direction). Each of the protruding portions 74*b*, 74*c*, and 74*d* in the second gate electrode 70*b*, the third gate electrode 70*c*, and the fourth gate electrode 70*d* may include a portion, a thickness of which is increased in the first direction (the X direction). Pad portions 70*pa*, 70*pb*, and 70*pc* disposed adjacent to the protruding portions 74*b*, 74*c*, and 74*d* in a horizontal direction may include the portion, a thickness of which is increased in the first direction (the X direction) and include a portion, a thickness of which is increased in a direction, perpendicular to the first direction (the X direction), for example, the second direction (the Y direction) as illustrated in FIG. 14A. The pad portion 70*pd* of the fourth gate electrode 70*d* may include a portion, a thickness of which is increased in the first direction (the X direction) and may not include a portion, a thickness of which is increased in the second direction (the Y direction).

A component material and structure of the protruding portions 74 may vary depending on a width of the protruding portions 74 in the second direction (the Y direction). Various examples of the protruding portions 74 described above will be, respectively, described with reference to FIGS. 14A, 14B, and 14C. Each of FIGS. 14A, 14B, and 14C is a partially enlarged view of area "E" of FIG. 12.

First, with reference to FIG. 14A, each of the protruding portions 74 may include the gate electrodes 70 and a second dielectric layer 72. For example, each of the protruding portions 74 may include a first conductive layer 76, a second conductive layer 78, and the second dielectric layer 72. The first conductive layer 76 of each of the protruding portions 74 may cover a lower surface and an upper surface of the second conductive layer 78 to be extended between a side surface of the second conductive layer 78 and a capping insulating structure INS. The second dielectric layer 72 of each of the protruding portions 74 may be interposed between the first conductive layer 76 and the capping insulating structure INS and may be extended between the first conductive layer 76 and an interlayer insulating layer 12.

Referring to FIG. 14B, each of the protruding portions 74 may include the first conductive layer 76 and the second dielectric layer 72. The second dielectric layer 72 may be interposed between the first conductive layer 76 and the capping insulating structure INS and may be extended between the first conductive layer 76 and the interlayer insulating layer 12.

Referring to FIG. 14C, each of the protruding portions 74 may include the second dielectric layer 72. The second dielectric layers 72 of the protruding portions 74 may have a form extended from a portion of the gate electrodes 70.

Figure 15:
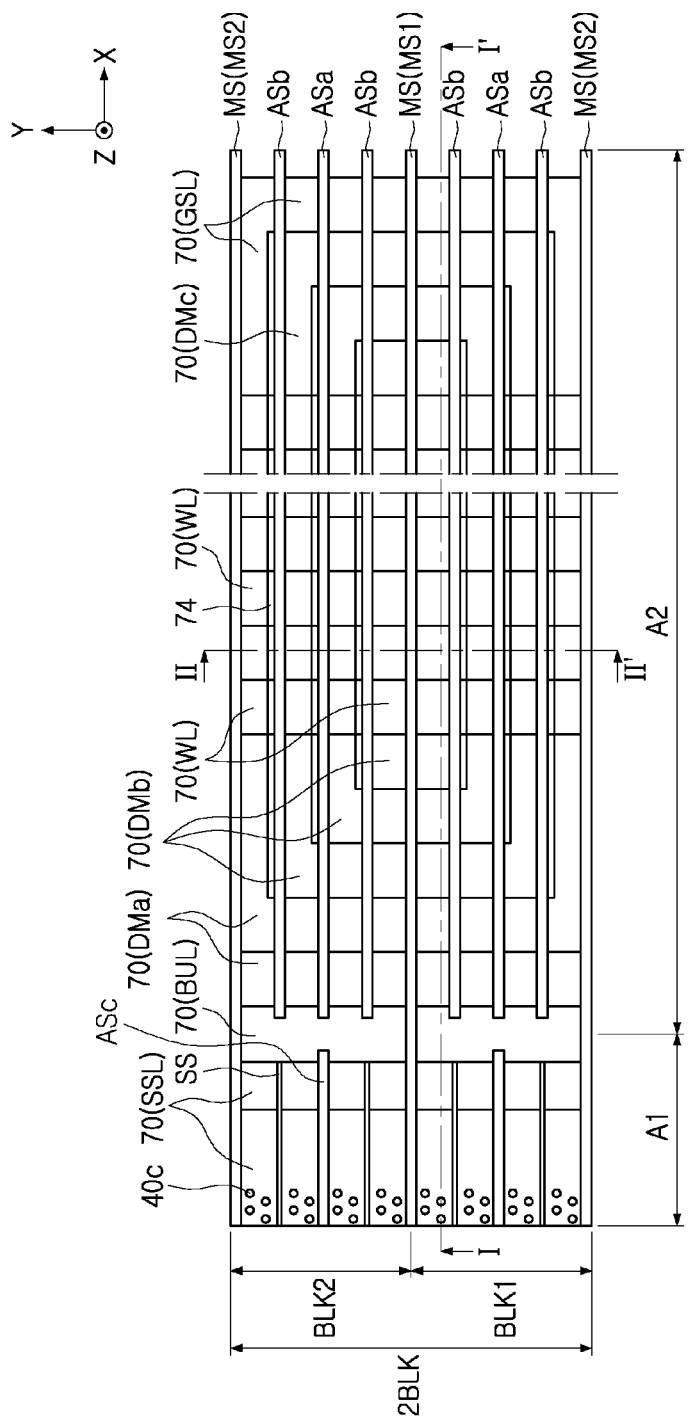
FIG. 15 is a schematic top view of a component of a three-dimensional semiconductor device according to a modified example embodiment.
Figure 16A:
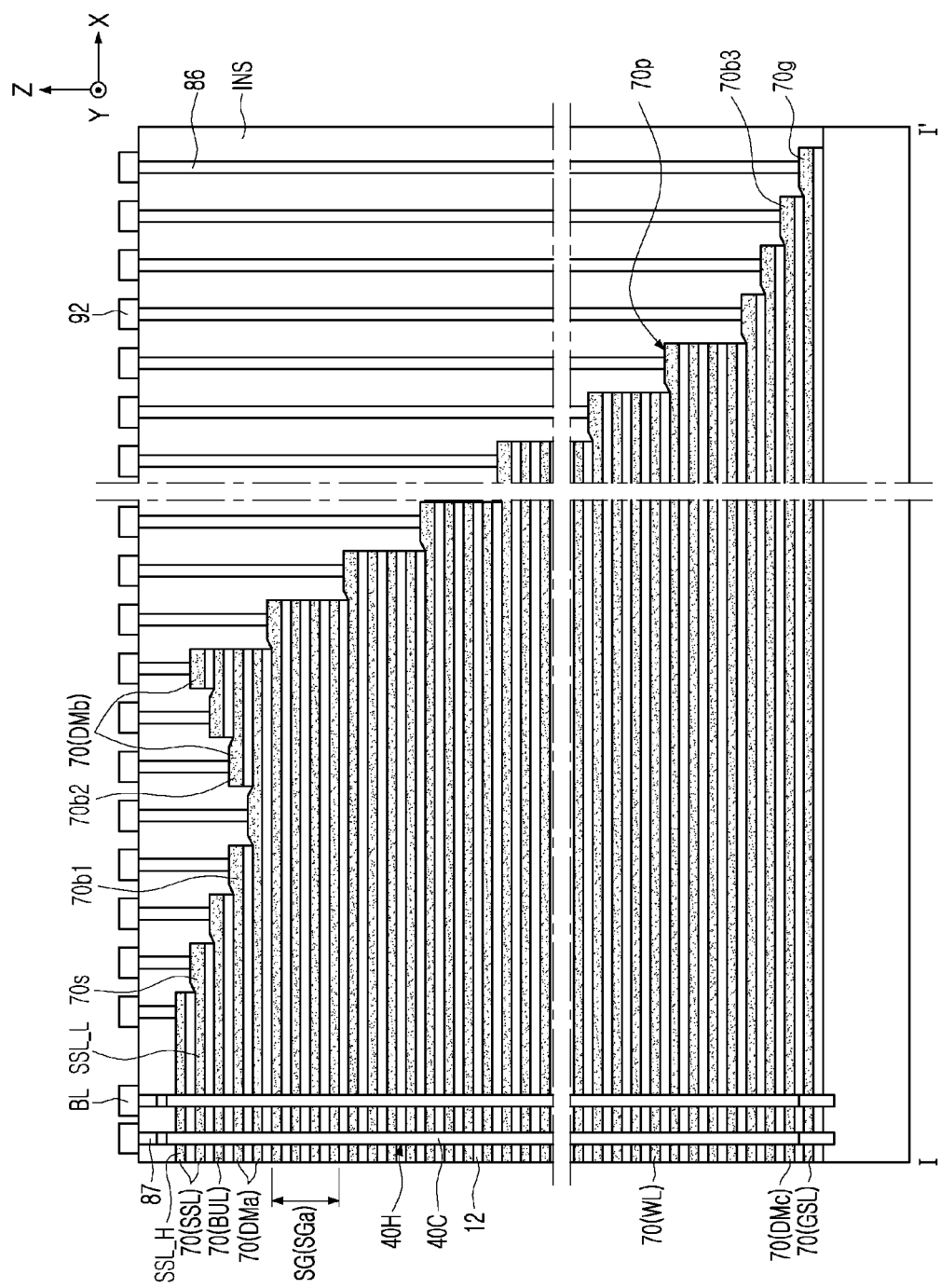
FIG. 16A is a cross-sectional view taken along line I-I' of FIG. 15.

As described with reference to FIGS. 1 to 14C, according to example embodiments, an uppermost stacked gate group SGa among the stacked gate groups SG may be disposed directly below a buffer line BUL. In addition, a ground select line GSL may be included in a lowermost stacked gate group (e.g., the lower stacked gate group SGb) among the stacked gate groups SG, but the present disclosure is not limited thereto. For example, upper dummy patterns may be additionally disposed between the uppermost stacked gate group SGa among the stacked gate groups SG and the buffer line BUL. A lower dummy pattern and the ground select line GSL may be disposed between the lowermost stacked gate group SG and a substrate 10. Examples in which dummy patterns and the ground select line GSL are disposed, as described above, will be described with reference to FIGS. 15, 16A, and 16B. FIG. 15 is a schematic top view of a component of a three-dimensional semiconductor device according to a modified example embodiment; FIG. 16A is a cross-sectional view taken along line I-I' of FIG. 15; and FIG. 16B is a cross-sectional view taken along line II-IF of FIG. 15.

Hereinafter, with reference to FIGS. 15, 16A, and 16B, only additional descriptions based on descriptions in FIGS. 11 to 14A will be provided. Thus, descriptions of components overlapping with those described in FIGS. 11 to 14A, as well as in FIGS. 1 to 10, will be omitted. Accordingly, components, not separately described, among components described with reference to FIGS. 15, 16A, and 16B may be construed as components described in FIGS. 1 to 10 and FIGS. 11 to 14A.

Figure 16B:
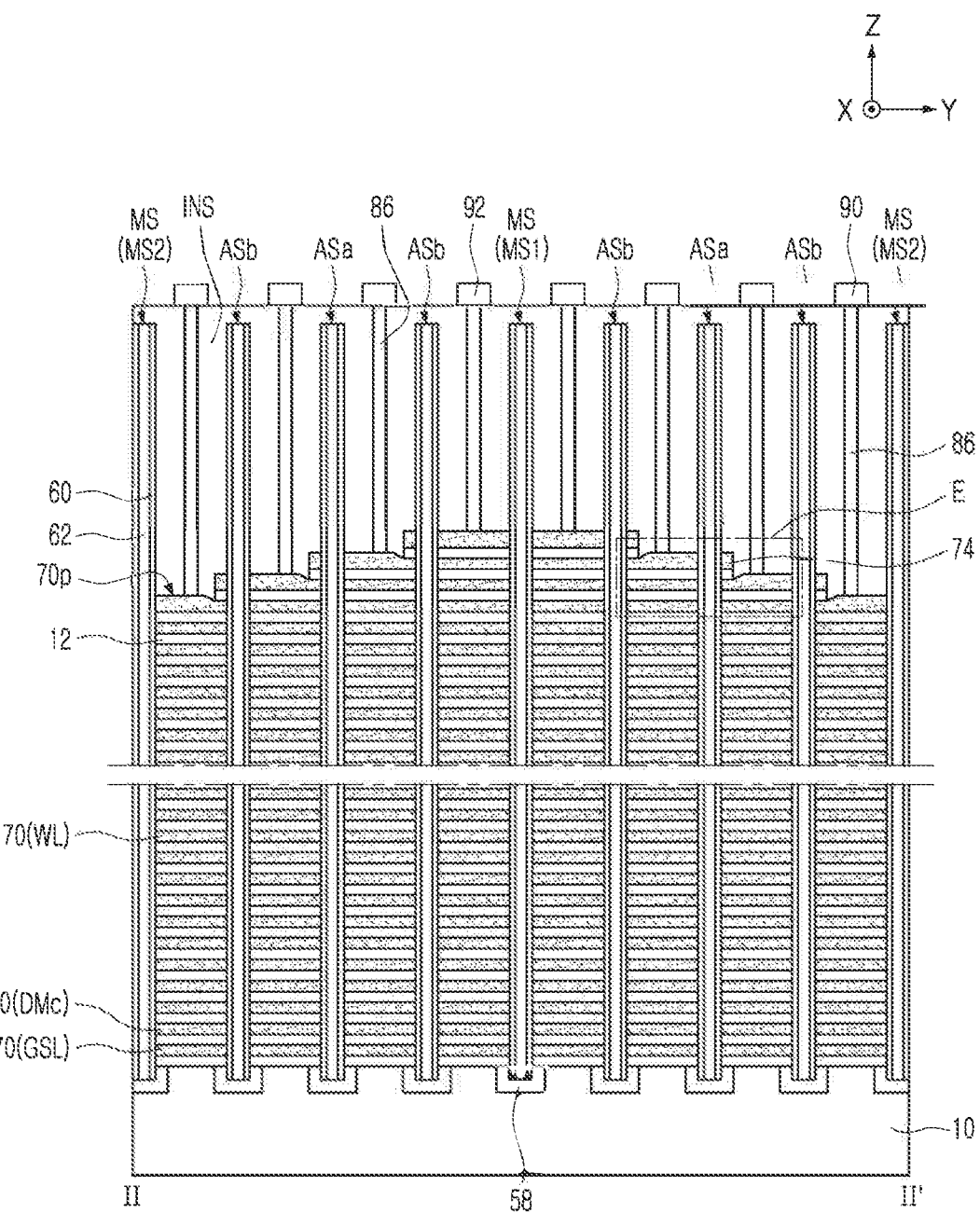
FIG. 16B is a cross-sectional view taken along line II-IF of FIG. 15.

With reference to FIGS. 15, 16A, and 16B, first upper dummy patterns DMa and second upper dummy patterns DMb may be disposed on an uppermost stacked gate group (e.g., the upper stacked gate group SGa) among stacked gate groups SG. The first upper dummy patterns DMa may be extended in a direction from a first area A1 to a second area A2. A buffer line BUL may be disposed on the first upper dummy patterns DMa.

The second upper dummy patterns DMb may not overlap the first area A1 of the substrate 10 and may be disposed on the second area A2 of the substrate 10 in one embodiment. The second upper dummy patterns DMb may be disposed to be spaced apart from gate electrodes 70 overlapping the first area A1 in another embodiment.

A string select line SSL may include at least two layers disposed at different levels. For example, the string select line SSL may include a lower string select line SSL_L and an upper string select line SSL_H on the lower string select line SSL_L. The upper string select line SSL_H may not include a pad portion, a thickness of which has been increased, while the lower string select line SSL_L may include a pad portion 70s, a thickness of which has been increased on an end portion thereof. Thus, the upper string select line SSL_L may be formed to have a uniform thickness, while the lower string select line SSL_L may be formed to have the end portion, for example, the pad portion 70s, a thickness of which has been increased.

The pad portion 70s of the lower string select line SSL_L and a pad portion 70b1 of the first upper dummy patterns DMa may be arranged to have a stepped structure formed downwardly in a first direction (an X direction) from the first area A1. The second upper dummy patterns DMb may include pad portions 70b2 having a stepped structure formed downwardly in a direction of the first upper dummy patterns DMa. Lower dummy patterns DMc may include pad portions 70b3 having a stepped structure formed downwardly in the first direction (the X direction) from the first area A1, while the ground select line GSL may include a pad portion 70g on an outermost side at a lowermost portion of the ground select line GSL.

Area "E" in FIG. 16B may have the same structure as area "E" in FIG. 12. Thus, descriptions of the protruding portions 74 in area "E" of FIG. 12 provided with reference to FIGS. 13, 14A, 14B, and 14C may be equally applied to the protruding portions 74 in area "E" of FIG. 16B.

Figure 17:
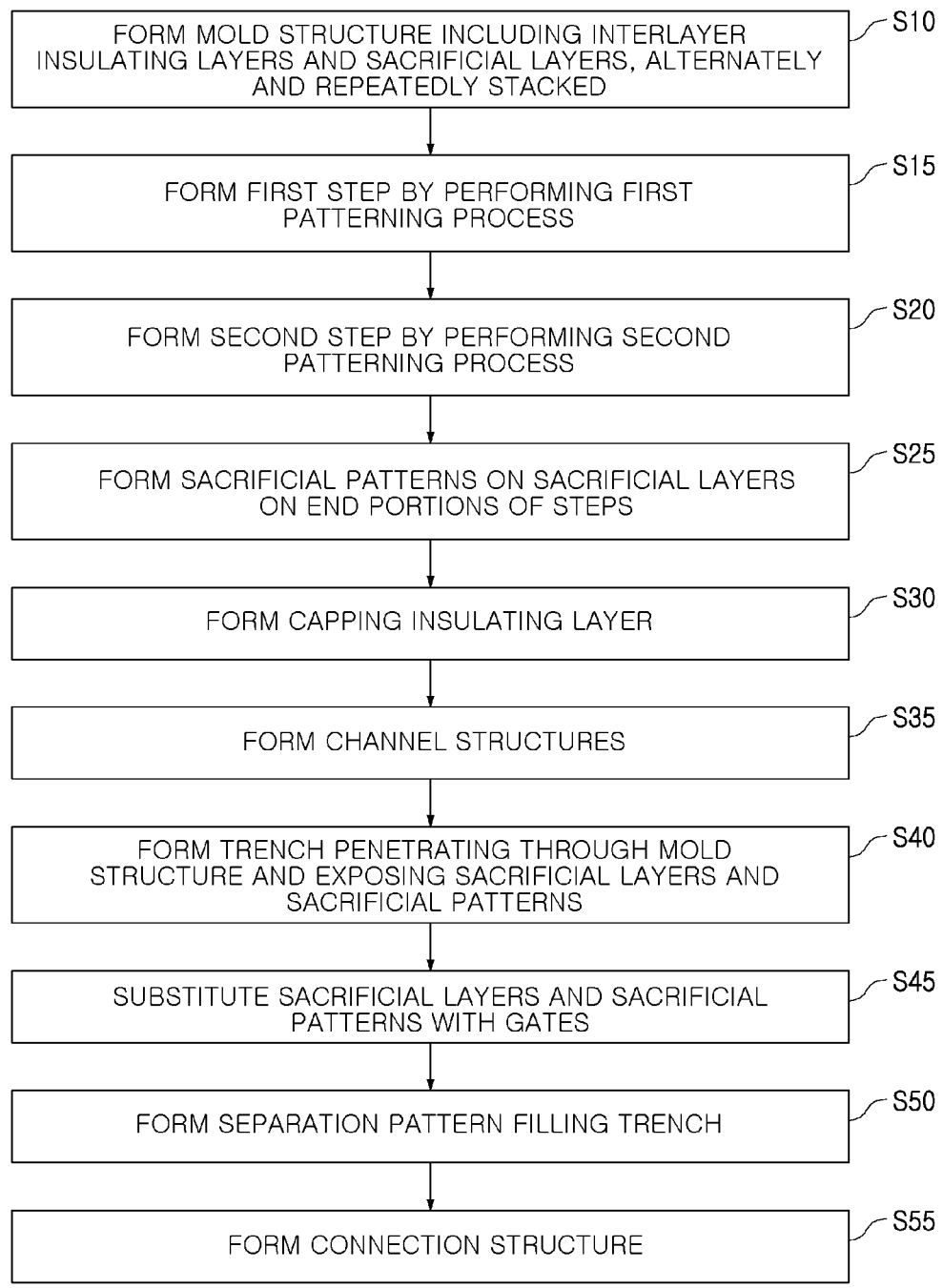
FIG. 17 is a flowchart illustrating a method of forming a three-dimensional semiconductor device according to example embodiments.

Subsequently, a method of forming a three-dimensional semiconductor device according to example embodiments with reference to FIG. 17 will be described. FIG. 17 is a flowchart illustrating the method of forming a three-dimensional semiconductor device according to example embodiments.

With reference to FIG. 17, a mold structure including interlayer insulating layers and sacrificial layers, alternately and repeatedly stacked, may be formed in S10. A first step may be formed by performing a first patterning process in S15. A second step may be formed by performing a second patterning process in S20. The first step and the second step may have a structure formed downwardly in directions perpendicular to each other. Sacrificial patterns may be formed on the sacrificial layers of end portions of the first step and the second step in S25. A capping insulating layer may be formed in S30. The capping insulating layer may cover the mold structure and the sacrificial patterns. Channel structures may be formed in S35. The channel structures may penetrate through the mold structure. Trenches penetrating through the mold structure and exposing the sacrificial layers and the sacrificial patterns may be formed in S40. The sacrificial layers and the sacrificial patterns may be substituted with gates in S45. Separation patterns filling the trenches may be formed in S50. Connection structures may be formed in S55.

Figure 18A:
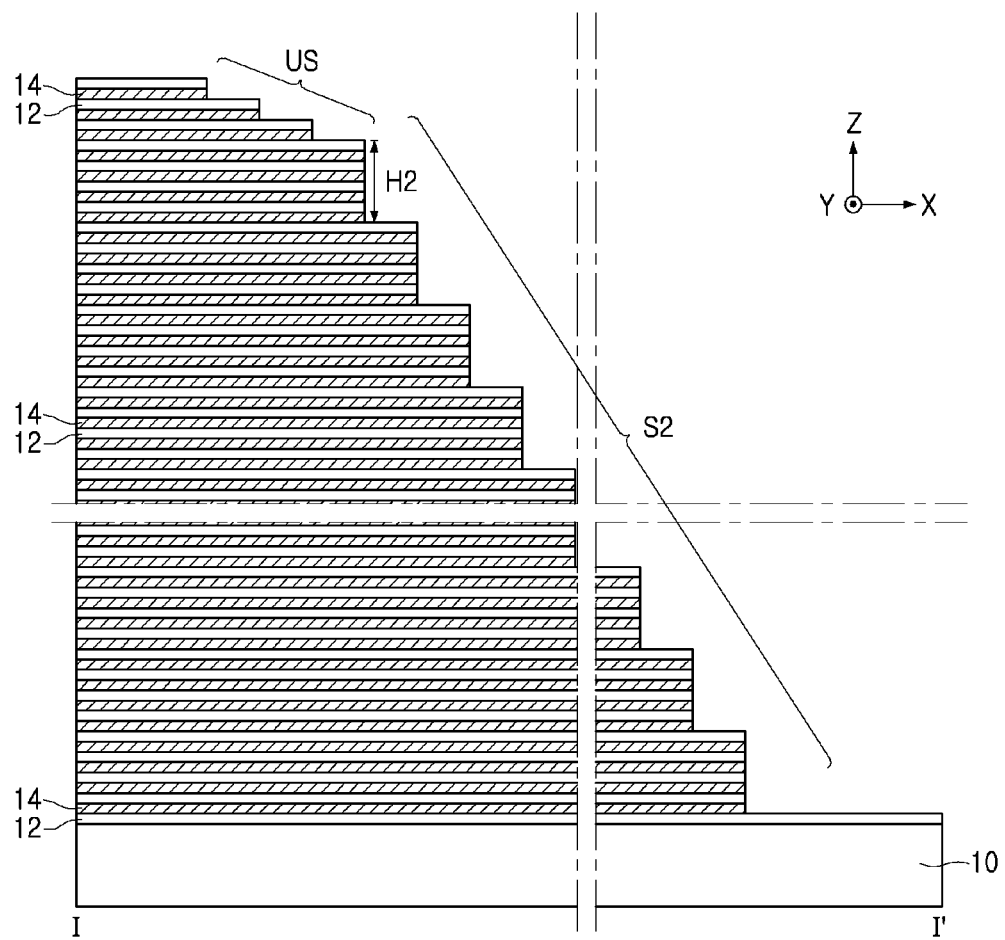
FIGS. 18A, 18B, 19A, 19B, 21A, and 21B are cross-sectional views illustrating a method of forming a three-dimensional semiconductor device according to example embodiments.
Figure 18B:
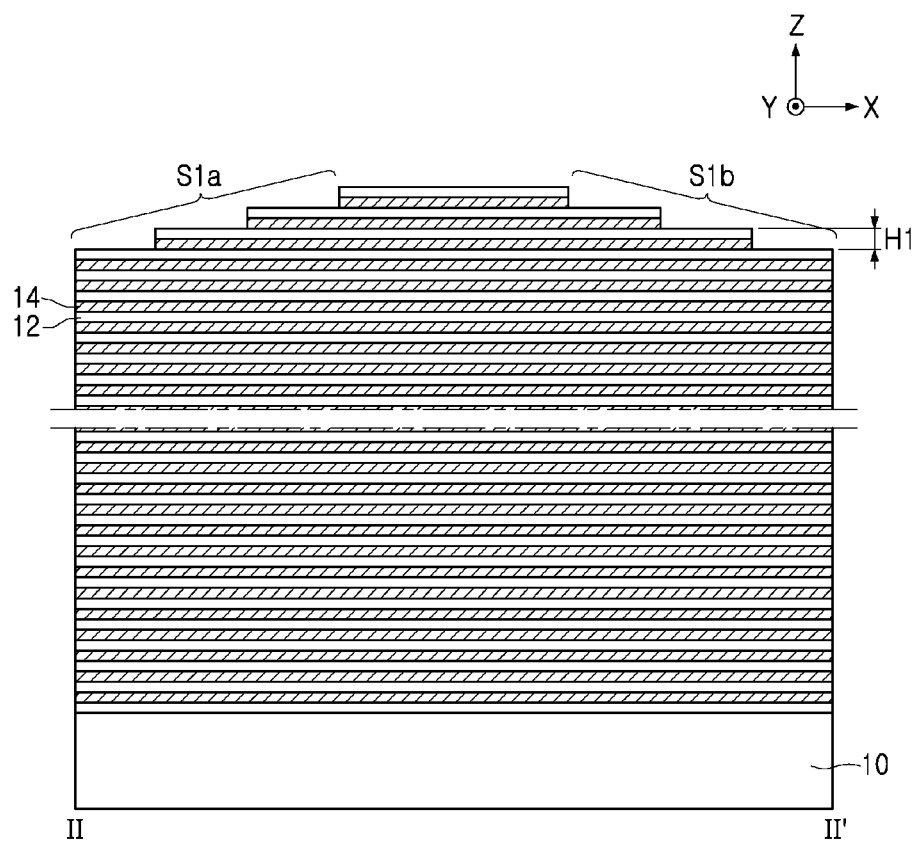
Figure 19A:
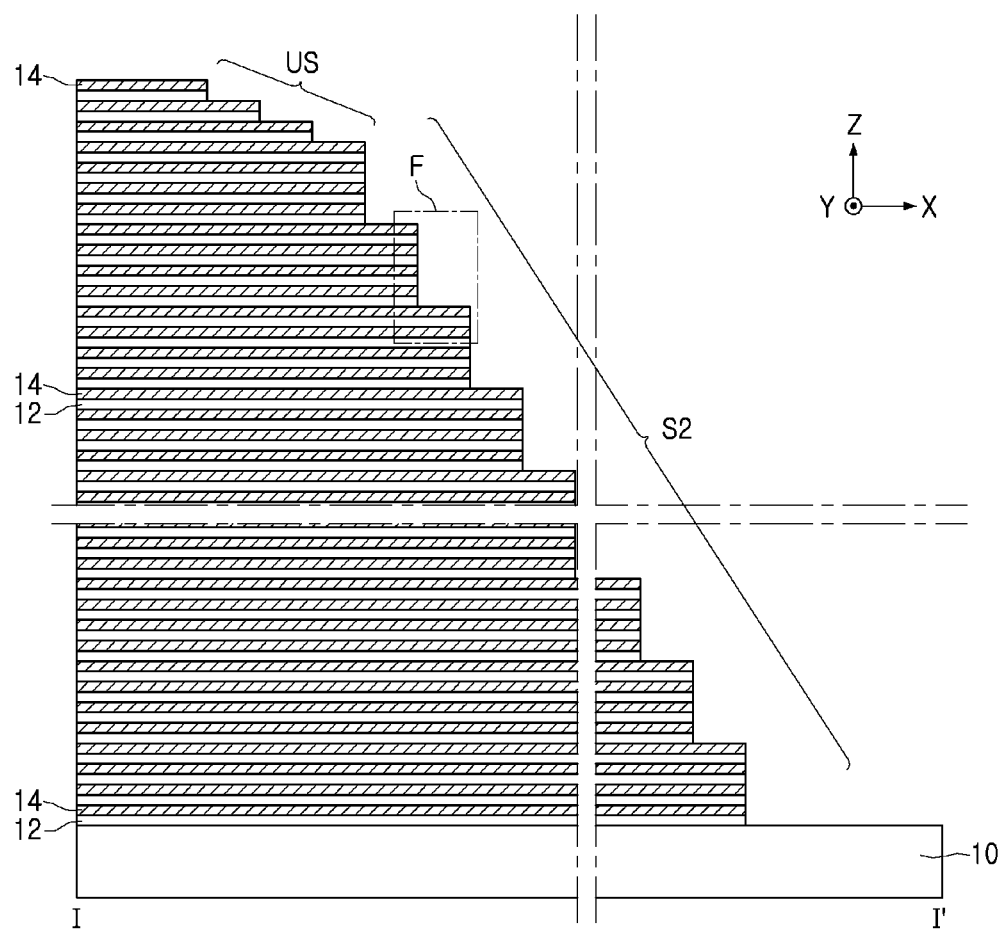
Figure 19B:
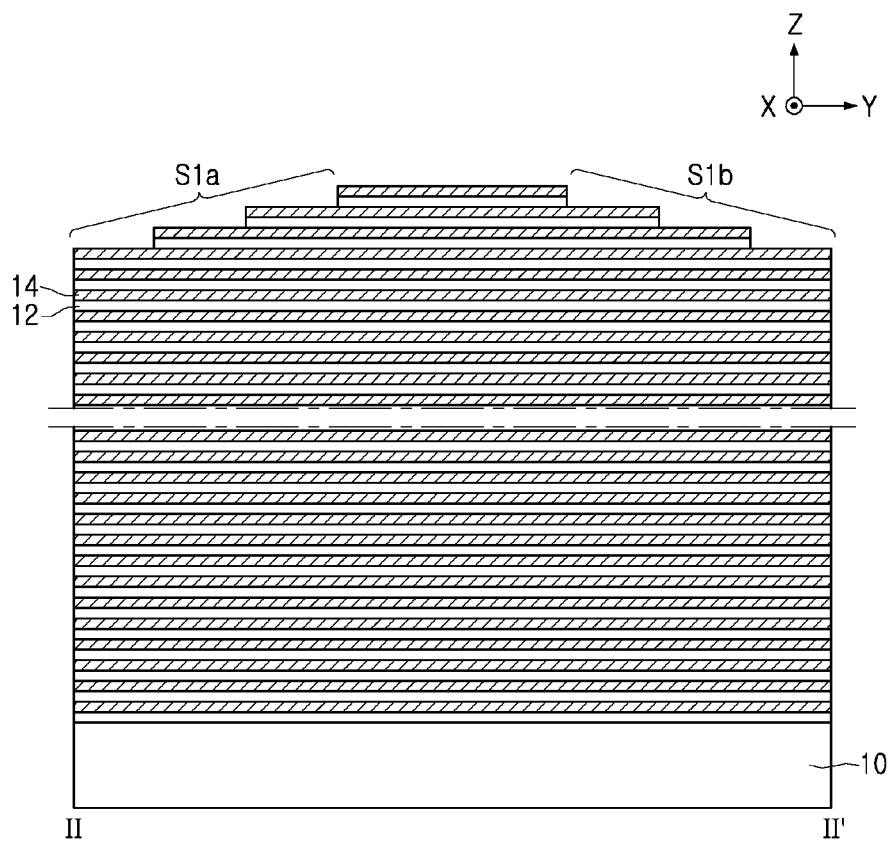
Figure 20A:
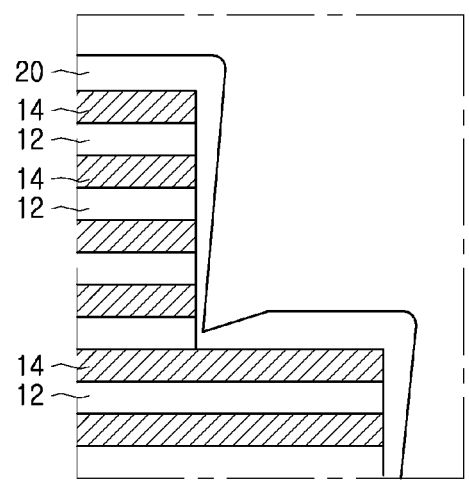
FIGS. 20A, 20B, 22A, and 22B are partially enlarged views illustrating a method of forming a three-dimensional semiconductor device according to example embodiments of the present disclosure.
Figure 20B:
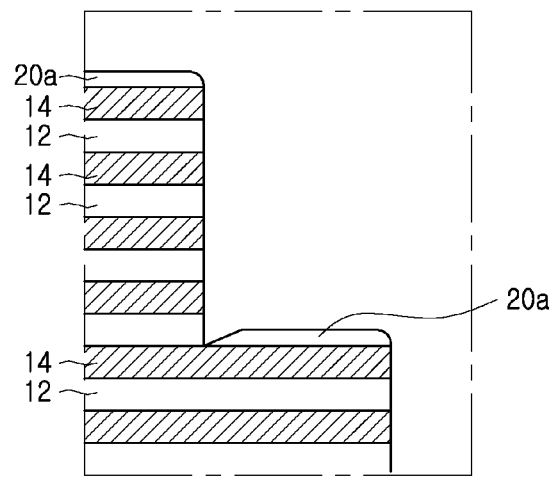
Figure 21A:
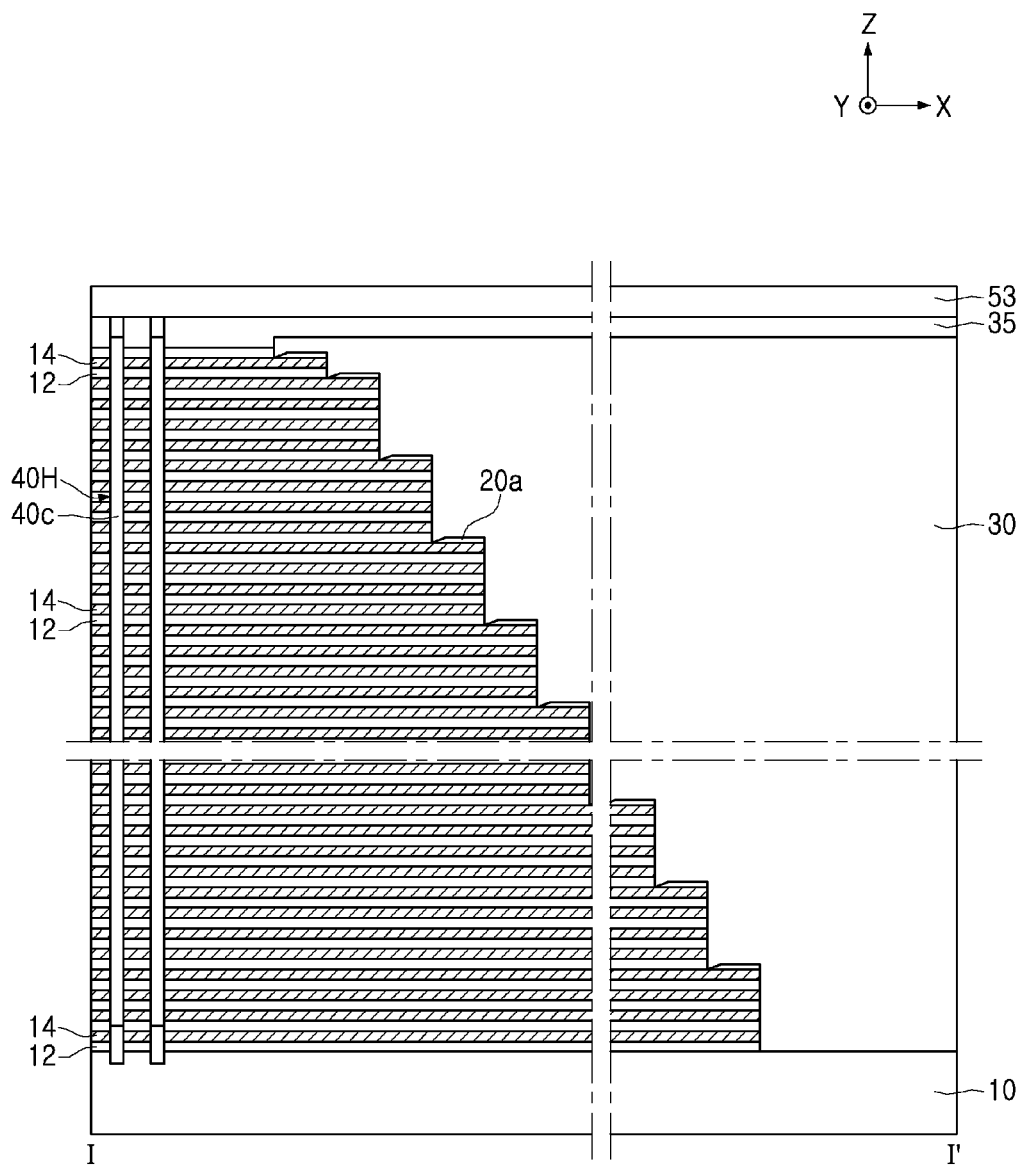
Figure 21B:
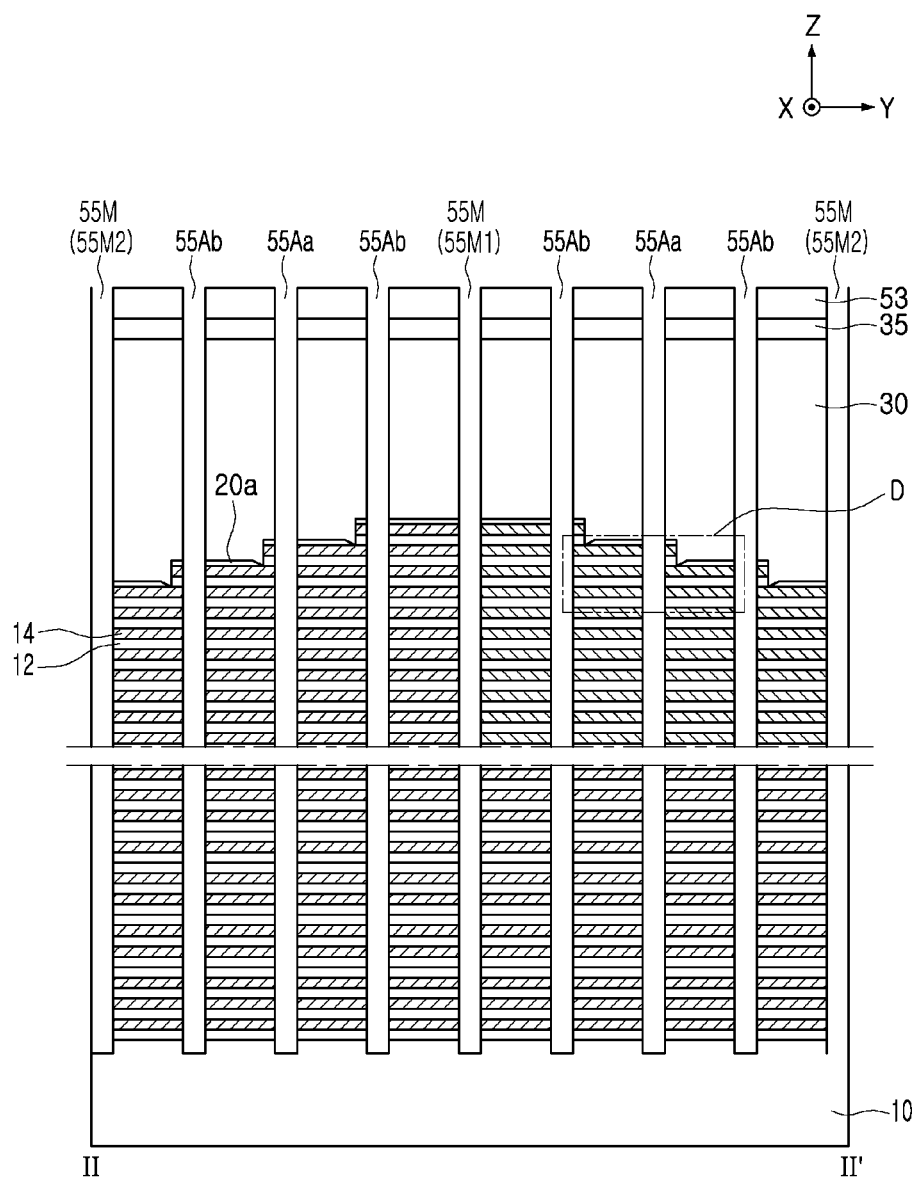
Figure 22A:
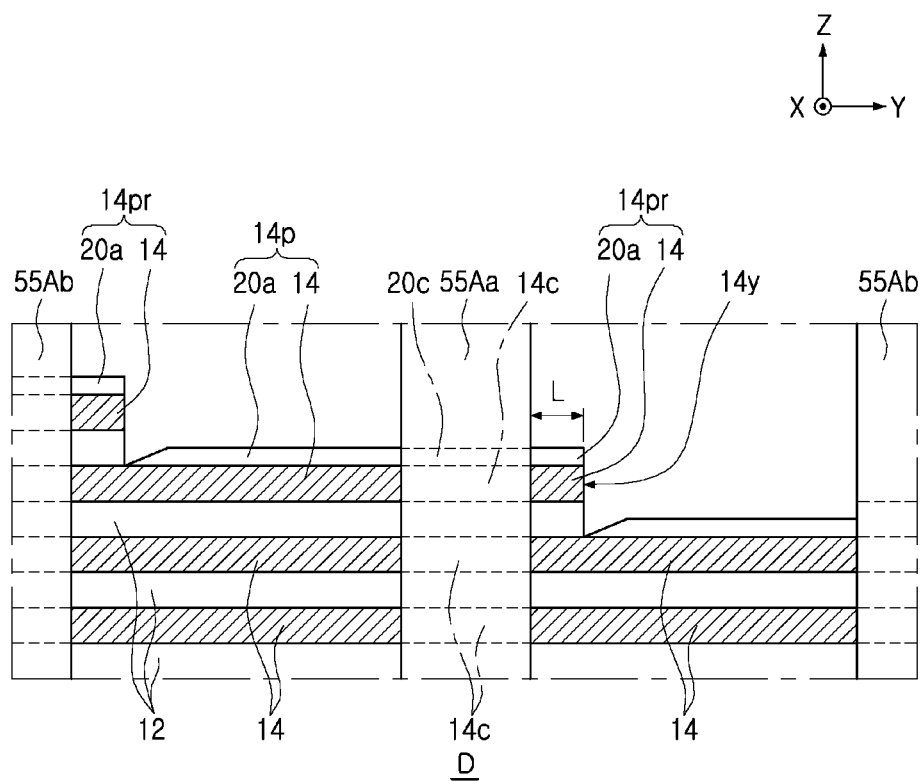
Figure 22B:
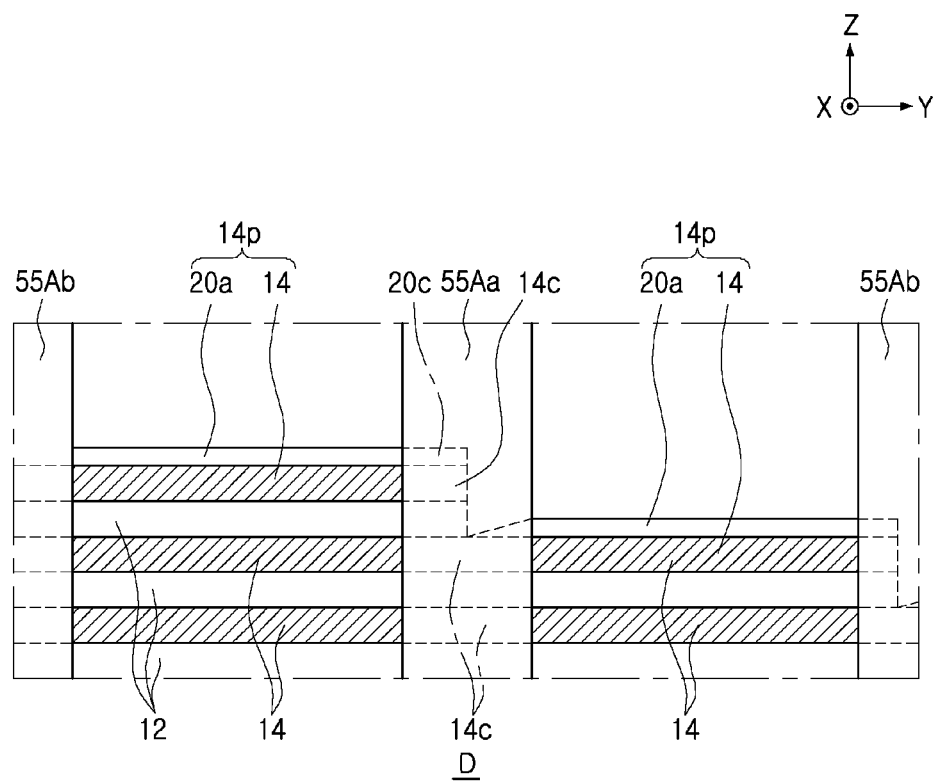

An example of the method of forming a three-dimensional semiconductor device according to example embodiments described with reference to FIG. 17 will be described with reference to FIGS. 18A to 22B together with FIG. 11. FIGS. 18A, 19A, and 21A are cross-sectional views taken along line I-I' of FIG. 11; FIGS. 18B, 19B, and 21B are cross-sectional views taken along line II-IF of FIG. 11; FIGS. 20A and 20B are partially enlarged views of area "F" of FIG. 19A; and FIGS. 22A and 22B are partially enlarged views of area "D" of FIG. 21B.

With reference to FIGS. 11, 17, 18A, and 18B, a mold structure including interlayer insulating layers 12 and sacrificial layers 14, alternately and repeatedly stacked, may be formed in S10. The mold structure may be formed on a substrate 10. The substrate 10 may be provided as a semiconductor substrate. The substrate 10 may include a first area A1 and a second area A2. The sacrificial layers 14 may be formed using a silicon nitride, while the interlayer insulating layers 12 may be formed using a silicon oxide.

First steps S1a and S1b may be formed by performing a first patterning process in S15. A second step S2 may be formed by performing a second patterning process in S20. The first patterning process and the second patterning process may be performed to the mold structure. Thus, the mold structure may include the first steps S1a and S1b and the second step S2 having stepped structures formed downwardly in different directions. The first steps S1a and S1b and the second step S2 may be formed on the second area A2 of the substrate 10.

The first steps S1a and S1b may be formed to have a structure formed downwardly from any one portion thereof, for example, a central portion, in opposing directions. The first steps S1a and S1b may have a stepped structure formed downwardly by a first height H1, while the second step S2 may have a stepped structure formed downwardly by a second height H2 greater than the first height H1.

An upper step US may be formed in an upper area of the mold structure. The upper step US may be provided as a step of a string select line (SSL of FIGS. 5, 7A, and 7B) and a buffer line (BUL of FIGS. 5 and 7A). The first steps S1a and S1b and the second step S2 may be provided as steps of stacked gate groups (SG of FIGS. 5, 7A, and 7B).

In an example embodiment, after the upper step US is formed, the first steps S1a and S1b and the second step S2 may be formed on the second area A2 of the substrate 10 by patterning interlayer insulating layers 12 and sacrificial layers 14, disposed below the upper step US. Patterning processes described above may be performed using photoresist patterns. For example, after a photoresist pattern is formed, a portion of the mold structure below the photoresist pattern is etched, and a size of the photoresist pattern is reduced. Using a method of repeatedly etching a portion of the mold structure using a reduced photoresist pattern, the first steps S1a and S1b, the second step S2, and the upper step US may be formed.

In an example embodiment, the interlayer insulating layers 12 may be exposed in the first steps S1a and S1b, the second step S2, and the upper step US.

With reference to FIGS. 11, 17, 19A, and 19B, exposed portions of the interlayer insulating layers 12 may be removed from the first steps S1a and S1b, the second step S2, and the upper step US. Thus, the sacrificial layers 14 may be exposed in the first steps S1a and S1b, the second step S2, and the upper step US.

Subsequently, sacrificial patterns may be formed on the sacrificial layers 14 exposed in the first steps S1a and S1b, the second step S2, and the upper step US in S25. An example of a method of forming the sacrificial patterns will be described with reference to FIGS. 20A and 20B.

With reference to FIGS. 11, 17, 19A, and 19B, as well as FIG. 20A, a sacrificial insulating layer 20 may be formed on a substrate including the first steps S1a and S1b, the second step S2, and the upper step US. The sacrificial insulating layer 20 may be formed using a material having a selective etching rating similar to or equal to that of the sacrificial layers 14. For example, the sacrificial insulating layer 20 may be formed using a silicon nitride. The sacrificial insulating layer 20 may be formed in such a manner that a thickness of the sacrificial insulating layer 20 deposited on a side surface of the first steps S1a and S1b, the second step S2, and the upper step US is thinner than that of the sacrificial insulating layer 20 deposited on an upper surface of the first steps S1a and S1b, the second step S2, and the upper step US.

With reference to FIGS. 11, 17, 19A, and 19B, as well as FIG. 20B, sacrificial patterns 20a may be formed by partially etching the sacrificial insulating layer (20 of FIG. 20A). The sacrificial patterns 20a may be formed on an upper surface of exposed portions of the sacrificial layers 14, for example, on an upper surface of a stepped structure. Partial etching of the sacrificial insulating layer (20 of FIG. 20A) may include isotropic etching of the sacrificial insulating layer (20 of FIG. 20A). Thus, in the sacrificial insulating layer (20 of FIG. 20A), the sacrificial insulating layer (20 of FIG. 20A) disposed on a side surface of the stepped structure and having a relatively thinner thickness may be first removed. The sacrificial insulating layer (20 of FIG. 20A) disposed on an upper surface of the stepped structure and having a relatively thicker thickness may remain to be formed as the sacrificial patterns 20a.

With reference to FIGS. 11, 17, 21A, and 21B, a first capping insulating layer 30 may be formed. The first capping insulating layer 30 may be formed on a substrate including the sacrificial patterns 20a. In an example embodiment, an uppermost sacrificial layer, among the sacrificial layers 14, may be removed. However, an operation of removing the uppermost sacrificial layer may be omitted.

The first capping insulating layer 30 and a second capping insulating layer 35 covering the mold structure may be formed.

Channel structures 40C may be formed on the first area A1 of the substrate 10. The channel structures 40C may extend in a third direction (a Z direction) from a surface of the substrate 10. The channel structures 40C may be formed in channel holes 40H penetrating through the interlayer insulating layers 12, the sacrificial layers 14, and the second capping insulating layer 35 of the mold structure. Forming the channel structures 40C may include forming semiconductor patterns on the substrate 10 exposed by the channel holes 40H, forming an information storage layer and a first dielectric layer on side walls of the channel holes 40H on the semiconductor patterns, forming a semiconductor layer conformally covering the channel holes 40H, forming core patterns partially filling the channel holes 40H on the semiconductor layer, and forming pad patterns filling the remainder of portions of the channel holes 40H on the core patterns. Thus, the channel structures 40C having the same structure as that described in FIG. 8 may be formed. A third capping insulating layer 53 covering the channel structures 40C may be formed on the second capping insulating layer 35.

Trenches penetrating through the second capping insulating layer 35, the third capping insulating layer 53, and the mold structure and exposing the sacrificial layers 14 and the sacrificial patterns 20a may be formed in S40. The trenches to form main separation patterns MS, a first secondary separation pattern ASa, second secondary separation patterns ASb, and a cell secondary separation pattern ASc, described in FIG. 11, may be formed in the same position as the main separation patterns MS, the first secondary separation pattern ASa, the second secondary separation patterns ASb, and the cell secondary separation pattern ASc, described in FIG. 11.

The trenches may include main separation trenches 55M and secondary separation trenches 55Ab and 55Aa between the main separation trenches 55M.

The main separation trenches 55M may include a first main separation trench 55M1 and second main separation trenches 55M2. The first main separation trench 55M1 may be disposed between the second main separation trenches 55M2. The secondary separation trenches 55Ab and 55Aa may also be referred to as a first secondary separation trench 55Aa and second secondary separation trench 55Ab. The first secondary separation trench 55Aa may be disposed between the first main separation trench 55M1 and the second main separation trench 55M2 and the second secondary separation trenches 55Ab may be disposed between the first secondary separation trench 55Aa and the first and second main separation trenches 55M1 and 55M2.

The main separation trenches 55M, the first secondary separation trench 55Aa, and the second secondary separation trenches 55Ab may expose the sacrificial layers 14 and the sacrificial patterns 20a.

A portion of the sacrificial patterns 20a may be cut by the main separation trenches 55M, the first secondary separation trench 55Aa, and the second secondary separation trenches 55Ab, so that the sacrificial patterns 20a may be exposed. An example in which the portion of the sacrificial patterns 20a is cut, as such, will be described with reference to FIG. 22A.

With reference to FIG. 22A, the main separation trenches 55M, the first secondary separation trench 55Aa, and the second secondary separation trenches 55Ab may intersect the sacrificial patterns 20a to cut. A portion 20c of the sacrificial patterns 20a and a portion 14c of the sacrificial layers 14 may be removed by the main separation trenches 55M, the first secondary separation trench 55Aa, and the second secondary separation trenches 55Ab, so that the sacrificial patterns 20a and the sacrificial layers 14 may be exposed.

A portion among the sacrificial patterns 20a divided by the main separation trenches 55M, the first secondary separation trench 55Aa, and the second secondary separation trenches 55Ab may form a sacrificial pad portion 14p together with a sacrificial layer 14. A remainder among the sacrificial patterns 20a divided by the main separation trenches 55M, the first secondary separation trench 55Aa, and the second secondary separation trenches 55Ab may form a sacrificial protruding portion 14pr together with a sacrificial layer 14.

With reference to FIGS. 11, 12, 14A, and 17 together with FIGS. 21A, 21B, and 22A, the sacrificial layers 14 and the sacrificial patterns 20a may be substituted with gates. For example, substituting the sacrificial layers 14 and the sacrificial patterns 20a with the gates may include forming empty spaces by selectively removing the sacrificial layers 14 and the sacrificial patterns 20a exposed by the main separation trenches 55M, the first secondary separation trench 55Aa, and the second secondary separation trenches 55Ab, sequentially forming a second dielectric layer 72 and gate electrodes 70, filling the empty spaces and covering side walls of the main separation trenches 55M, the first secondary separation trench 55Aa, and the second secondary separation trenches 55Ab, and etching the second dielectric layer 72 and the gate electrodes 70 disposed in the main separation trenches 55M, the first secondary separation trench 55Aa, and the second secondary separation trenches 55Ab. The second dielectric layer 72 and the gate electrodes 70 may be etched to remain in the empty spaces. In an example embodiment, the gate electrodes 70 may be etched to have a width narrower than that of the interlayer insulating layers 12.

In an example embodiment, the sacrificial pad portion 14p may be substituted with pad portions 70p of the gate electrodes 70 and the second dielectric layer 72 in contact with the pad portions 70p, as described in FIG. 14A.

In an example embodiment, the sacrificial protruding portion 14pr may be substituted with the protruding portions 74 of the gate electrodes 70, as described in FIG. 14A.

A width L of the sacrificial protruding portion 14pr in a second direction (a Y direction) may be determined depending on a process margin required for a semiconductor process to form a three-dimensional semiconductor device. For example, in a case in which the width L of the sacrificial protruding portion 14pr in the second direction (the Y direction) is reduced, the sacrificial protruding portion 14pr may be substituted with the protruding portions 74 of the gate electrodes 70, as described in FIG. 14B. In a case in which the width L of the sacrificial protruding portion 14pr in a second direction (a Y direction) is further reduced, the sacrificial protruding portion 14pr may be substituted with the protruding portions 74 of the gate electrodes 70, as described in FIG. 14C.

In a modified example embodiment, as described in FIG. 22B, the first secondary separation trench 55Aa and the second secondary separation trenches 55Ab may cut an end portion of the sacrificial pad portion 14p in the second direction (the Y direction), in order not to form the sacrificial protruding portion 14pr. The sacrificial pad portion 14p, formed as described above, may be substituted with pad portions 70p of the gate electrodes 70 and the second dielectric layer 72 in contact with the pad portions 70p, as described in FIG. 10.

With reference to FIGS. 11, 12, 14A, and 17, impurity areas 58 may be formed in the substrate 10 exposed by the main separation trenches 55M, the first secondary separation trench 55Aa, and the second secondary separation trenches 55Ab. The main separation patterns MS, the first secondary separation pattern ASa, the second secondary separation patterns ASb, and the cell secondary separation pattern ASc, filling the main separation trenches 55M, the first secondary separation trench 55Aa, and the second secondary separation trenches 55Ab may be formed. Forming the main separation patterns MS, the first secondary separation pattern ASa, the second secondary separation patterns ASb, and the cell secondary separation pattern ASc may include forming spacer portions 60 on side walls of the main separation trenches 55M, the first secondary separation trench 55Aa, and the second secondary separation trenches 55Ab and forming core portions 62 filling the main separation trenches 55M, the first secondary separation trench 55Aa, and the second secondary separation trenches 55Ab. The spacer portions 60 may be formed using an insulating material, such as a silicon oxide, or the like. The core portions 62 may be formed using a conductive material, such as W, polysilicon, or the like. The impurity areas 58 may be formed by forming the spacer portions 60 and then performing an ion implantation process. Thus, the main separation patterns MS, the first secondary separation pattern ASa, the second secondary separation patterns ASb, and the cell secondary separation pattern ASc may be formed, as described in FIGS. 11, 12, and 14A.

Subsequently, a connection structure may be formed in S55. As a description of a structure of the three-dimensional semiconductor device is provided, forming the connection structure may include forming bit line contact plugs 87 on the channel structures 40C, forming contact plugs 86 on pad portions 70s, 70f, and 70p, and forming bit lines BL and gate lines 92 on the bit line contact plugs 87 and the gate contact plugs 86.

As set forth above, according to example embodiments of the present disclosure, a three-dimensional semiconductor device improving a degree of integration, reliability, and durability and a method of forming the same may be provided.

While example embodiments have been shown and described above, it will be apparent to those skilled in the art that modifications and variations could be made without departing from the scope of the present disclosure as defined by the appended claims.

What is claimed is:

1. A semiconductor device, comprising:
a first main separation structure and a second main separation structure on a substrate;
a plurality of gate electrodes disposed on a substrate and disposed between the first main separation structure and the second main separation structure; and
a first secondary separation structure penetrating through at least some of the plurality of gate electrodes and disposed between the first main separation structure and the second main separation structure,
wherein the plurality of gate electrodes include a lower gate electrode, a first intermediate gate electrode on the lower gate electrode, and an upper gate electrode on the first intermediate gate electrode,
wherein the lower gate electrode includes a lower gate region and a lower pad region extending from the lower gate region,
wherein the first intermediate gate electrode includes a first intermediate gate region and a first intermediate pad region extending from the first intermediate gate region,
wherein the upper gate electrode includes an upper gate region and an upper pad region extending from the upper gate region,
wherein the first secondary separation structure intersects the first intermediate pad region and divides the first intermediate pad region into a first intermediate pad portion and a first intermediate protruding portion,
wherein a width of the first intermediate pad portion is greater than a width of the first intermediate protruding portion,
wherein each of the lower gate region, the first intermediate gate region, and the upper gate region has a first thickness, and
wherein each of the lower pad region, the first intermediate pad region, and the upper pad region has a second thickness greater than the first thickness.

2. The semiconductor device of claim 1, wherein the first secondary separation structure extends in a first direction parallel to an upper surface of the substrate, and
wherein the upper pad region, the first intermediate pad region, and the lower pad region are arranged to have a stepped shape lowered in a second direction perpendicular to the first direction.

3. The semiconductor device of claim 1, further comprising a plurality of contact plugs on the plurality of gate electrodes,
wherein the plurality of contact plugs include a first contact plug contacting the lower pad region, a second contact plug contacting the first intermediate pad portion of the first intermediate pad region, and a third contact plug contacting the upper pad region, and
wherein the first intermediate protruding portion is spaced apart from the plurality of contact plugs.

4. The semiconductor device of claim 1, wherein each of the first intermediate pad portion and the first intermediate protruding portion has the second thickness.

5. The semiconductor device of claim 1, wherein the plurality of gate electrodes further include a second intermediate gate electrode between the first intermediate gate electrode and the lower gate electrode, and
wherein the second intermediate gate electrode includes a second intermediate gate region and a second intermediate pad region extending from the second intermediate gate region,
wherein second intermediate gate region has the first thickness,
wherein the second intermediate pad region has the second thickness,
wherein the first secondary separation structure extends in a first direction parallel to an upper surface of the substrate, and
wherein the upper pad region, the first intermediate pad region, the second intermediate pad region, and the lower pad region are arranged to have a stepped shape lowered in a second direction perpendicular to the first direction.

6. The semiconductor device of claim 5, further comprising a second secondary separation structure disposed between the first main separation structure and the second main separation structure,
wherein the second secondary separation structure divides any one of the second intermediate pad region and the upper pad region into a pad portion and a protruding portion,
wherein the upper pad region is adjacent to the first main separation structure, and
wherein the lower pad region is adjacent to the second main separation structure.

7. The semiconductor device of claim 1, wherein the plurality of gate electrodes further include a second intermediate gate electrode between the first intermediate gate electrode and the upper gate electrode, and
wherein the second intermediate gate electrode includes a second intermediate gate region and a second intermediate pad region extending from the second intermediate gate region,
wherein the second intermediate gate region has the first thickness,
wherein the second intermediate pad region has the second thickness,
wherein the first secondary separation structure extends in a first direction parallel to an upper surface of the substrate, and
wherein the upper pad region, the second intermediate pad region, the first intermediate pad region, and the lower pad region are arranged to have a stepped shape lowered in a second direction perpendicular to the first direction.

8. The semiconductor device of claim 7, further comprising a second secondary separation structure disposed between the first main separation structure and the first secondary separation structure,
wherein the second secondary separation structure divides any one of the second intermediate pad region and the upper pad region into a pad portion and a protruding portion,
wherein the upper pad region is adjacent to the first main separation structure, and
wherein the lower pad region is adjacent to the second main separation structure.

9. The semiconductor device of claim 1, wherein each of the first main separation structure, the second main separation structure and the first secondary separation structure includes a conductive material layer and an insulating material layer between the conductive material layer and the plurality of gate electrodes.

10. A semiconductor device, comprising:
a first main separation structure and a second main separation structure disposed on a substrate and extending from a first area to a second area;
a first plurality of gate electrodes stacked in the first area in a vertical direction perpendicular to a surface of the substrate and extended to the second area, the first plurality of gate electrodes being between the first main separation structure and the second main separation structure; and
one or more secondary separation structures penetrating through at least some of the first plurality of gate electrodes, the one or more secondary separation structures being between the first and second main separation structures,
wherein the first plurality of gate electrodes includes one or more lower gate electrodes, a plurality of intermediate gate electrodes on the one or more lower gate electrodes, and one or more upper gate electrodes on the plurality of intermediate gate electrodes,
wherein the plurality of intermediate gate electrodes include a plurality of gate regions and a plurality of pad regions extending from the plurality of gate regions,
wherein the plurality of pad regions are disposed in the second area,
wherein at least one of the one or more secondary separation structures divide at least one of the plurality of pad regions into a pad portion and a protruding portion, and
wherein a width of the pad portion is greater than a width of the protruding portion.

11. The semiconductor device of claim 10, wherein at least some of the plurality of pad regions are arranged to have a first stepped structure formed downwardly by a first height in a first direction oriented from the first main separation structure to the second main separation structure and arranged to have a second stepped structure formed downwardly by a second height in a second direction oriented from the first area to the second area, and
wherein the second height is greater than the first height.

12. The semiconductor device of claim 10, wherein each of the plurality of gate regions has a first thickness, and
wherein each of the plurality of pad regions has a second thickness greater than the first thickness.

13. The semiconductor device of claim 12, wherein each of the pad portion and the protruding portion has the second thickness.

14. The semiconductor device of claim 10, further comprising:
- a third main separation structure on the substrate and extending from the first area to the second area, wherein the first main separation structure is between the second main separation structure and the third main separation structure; and
- a second plurality of gate electrodes stacked in the first area in the vertical direction and extended to the second area, the second plurality of gate electrodes being between the first main separation structure and the third main separation structure,
- wherein the first plurality of gate electrodes and the second plurality gate electrodes are mirror symmetric with respect to each other.

15. The semiconductor device of claim 10, wherein each of the first main separation structure, the second main separation structure, and the one or more secondary separation structures includes a conductive material layer and an insulating material layer between the conductive material layer and the first plurality of gate electrodes.

* * * * *